United States Patent
Baba et al.

(10) Patent No.: US 7,745,843 B2
(45) Date of Patent: Jun. 29, 2010

(54) SEMICONDUCTOR LIGHT EMITTING DEVICE

(75) Inventors: Toshihiko Baba, Yokohama (JP); Takuya Kazama, Tokyo (JP); Junichi Sonoda, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 330 days.

(21) Appl. No.: 11/904,290

(22) Filed: Sep. 26, 2007

(65) Prior Publication Data

US 2008/0149916 A1  Jun. 26, 2008

(30) Foreign Application Priority Data

Sep. 26, 2006 (JP) .............. 2006-261217
Sep. 26, 2006 (JP) .............. 2006-261218

(51) Int. Cl.
*H01L 33/00* (2010.01)
(52) U.S. Cl. ............ 257/98; 257/95; 257/E33.073; 257/E33.074
(58) Field of Classification Search ............ 257/98, 257/95, E33.073, E33.074
See application file for complete search history.

(56) References Cited

U.S. PATENT DOCUMENTS

| 5,779,924 | A | 7/1998 | Krames et al. | |
|---|---|---|---|---|
| 2002/0030194 | A1* | 3/2002 | Camras et al. | 257/98 |
| 2004/0028104 | A1* | 2/2004 | Buda et al. | 372/46 |
| 2004/0062283 | A1* | 4/2004 | Takeuchi et al. | 372/45 |
| 2004/0075095 | A1* | 4/2004 | Shakuda et al. | 257/79 |
| 2004/0206972 | A1* | 10/2004 | Erchak et al. | 257/98 |
| 2006/0289886 | A1* | 12/2006 | Sakai | 257/98 |
| 2007/0133648 | A1* | 6/2007 | Matsuda et al. | 372/102 |

FOREIGN PATENT DOCUMENTS

| JP | 10-4209 A | 1/1998 |
|---|---|---|
| JP | 2004-031221 A | 1/2004 |
| JP | 2004-128445 A | 4/2004 |
| JP | 2005-069709 A | 3/2005 |

* cited by examiner

*Primary Examiner*—Tu-Tu V Ho
(74) *Attorney, Agent, or Firm*—Frishauf, Holtz, Goodman & Chick, P.C.

(57) ABSTRACT

A light emitting device with an increased light extraction efficiency includes a two-dimensional periodic structure in a surface thereof and has two layers that together form an asymmetric refractive index distribution with respect to the active layer, which is in between the two layers. The light emitting device includes a substrate layer, a first layer, an active layer and a second layer that are stacked sequentially. The first layer includes at least one layer, including a semiconductor cladding layer of a first conductivity type. At least one layer of the first layer has a refractive index that is lower than a refractive index of the active layer and lower than a refractive index of a layer of the second layer that is adjacent to the active layer. Each constituent layer of the second layer has a refractive index that is lower than the refractive index of the active layer.

20 Claims, 18 Drawing Sheets

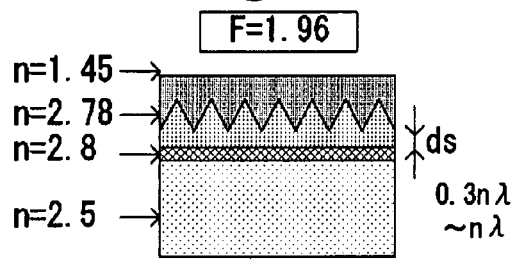
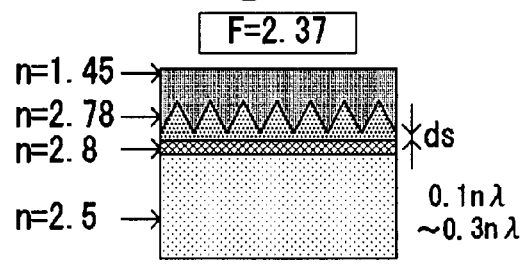
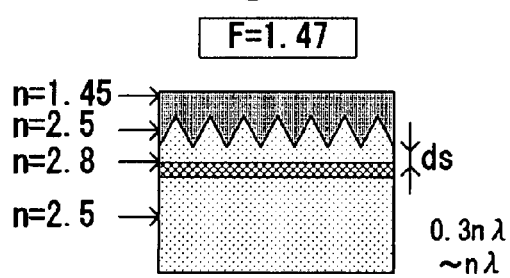
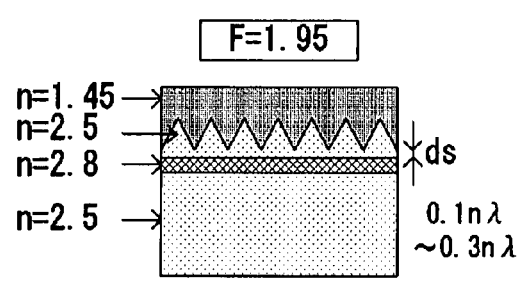
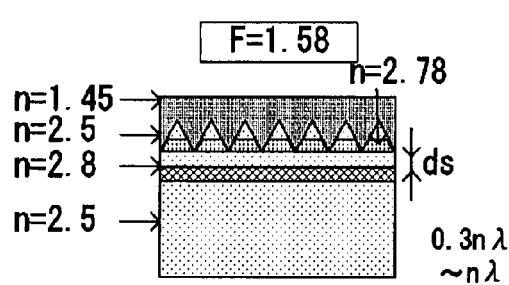
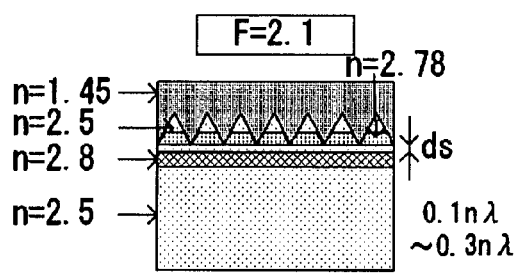

Fig. 15

| Construction | Schematic view | h=100nm h/λ₀=0.16 | h=200nm h/λ₀=0.31 | h=600nm h/λ₀=0.94 | h=1000nm h/λ₀=1.56 |
|---|---|---|---|---|---|
| Planar symmetric | n=3.26<br>n=3.41<br>n=3.26 | ... | 1.00 | 1.00 | 1.00 |
| Planar asymmetric | n=3.26<br>n=3.41<br>n=3.17 | ... | 0.94 | 0.94 | 0.94 |
| Two-dimensional periodic and symmetric | n=3.26<br>n=3.41<br>n=3.26 | 1.81 | 1.64 | 1.41 | 1.39 |
| Two-dimensional periodic, symmetric and intermediate layer | n=3.26<br>n=3.39<br>n=3.41<br>n=3.26 | ... | 1.72 | 1.43 | 1.37 |
| Two-dimensional periodic and asymmetric | n=3.26<br>n=3.41<br>n=3.17 | ... | 1.72 | 1.39 | 1.41 |
| Two-dimensional periodic, asymmetric and intermediate layer | n=3.26<br>n=3.39<br>n=3.41<br>n=3.17 | 2.39 | 2.01 | 1.49 | 1.41 |

$\lambda_0 = 640$ nm

Fig. 17

| Construction | Schematic view | h=120nm<br>h/λ₀=0.26 | h=400nm<br>h/λ₀=0.88 | h=600nm<br>h/λ₀=1.54 |
|---|---|---|---|---|
| Planar symmetric | n=2.50<br>n=2.53<br>n=2.50 | 1.00 | 1.00 | 1.00 |
| Planar asymmetric | n=2.50<br>n=2.53<br>n=2.40 | 0.93 | 0.93 | 0.93 |
| Two-dimensional period and symmetric (E) | n=2.50<br>n=2.53<br>n=2.50 | 1.31 | 1.31 | 1.31 |
| Two-dimensional period, symmetric and intermediate layer (F) | n=2.50<br>n=2.55<br>n=2.53<br>n=2.50 | 1.37 | 1.30 | 1.31 |
| Two-dimensional period and asymmetric (G) | n=2.50<br>n=2.53<br>n=2.40 | 1.61 | 1.49 | 1.44 |
| Two-dimensional period, asymmetric and intermediate layer (H) | n=2.50<br>n=2.55<br>n=2.53<br>n=2.40 | 1.69 | 1.54 | 1.44 |

$\lambda_0 = 455$ nm

SEMICONDUCTOR LIGHT EMITTING DEVICE

CROSS-REFERENCE TO RELATED APPLICATIONS

This application claims the priority benefit under 35 U.S.C. §119 of Japanese Patent Application No. 2006-261217 filed on Sep. 26, 2006 and Japanese Patent Application No. 2006-261218 filed on Sep. 26, 2006, which are hereby incorporated by reference in their entireties.

BACKGROUND OF THE INVENTION

1. Technical Field

The present invention relates to a semiconductor light emitting device (LED) that has high light extraction efficiency. More particularly, the present invention relates to an LED that has a two-dimensional periodic structure and has an asymmetric refractive index distribution with respect to the interposed active layer. The present invention further relates to a light emitting device (LED) that has high light extraction efficiency, has a two-dimensional periodic structure, and has an intermediate layer arranged on the light extraction side of the active layer. The intermediate layer has a refractive index that is lower than or equal to that of the active layer, but is the highest of all of the refractive indices of the semiconductor layers arranged on the light extraction side of the active layer.

2. Description of the Related Art

Semiconductor-based light emitting devices (LEDs) are expected to be used in a wide range of applications, including signs, displays and illuminations. Semiconductor materials generally have a higher refractive index than the surrounding medium, such as air and resins. Thus, the light emitted from an LED undergoes total internal reflection and is not effectively extracted outside. This leads to a problem that the efficiency of light utilization by LEDs is low. For example, semiconductor materials typically have a refractive index of 2.0 to 3.5 while the surrounding medium such as air and resins has a refractive index of 1.0 to 1.5. For this reason, the light emitted from a semiconductor material undergoes total internal reflection at the boundary of the semiconductor and the surrounding medium, allowing only a small percentage of the emitted light (i.e., a few percent) to escape from the LED.

Thus, a way is needed to effectively extract the light emitted from LEDs to the outside.

One approach is to form a periodic structure in the surface of a semiconductor (see, for example, U.S. Pat. No. 5,779,924, Japanese Patent Application Laid-Open No. Hei 10-4209, Japanese Patent Application Laid-Open No. 2004-128445, and Japanese Patent Application Laid-Open No. 2004-31221). The periodic structure in the surface of the semiconductor serves to change the wavenumber of the internal light and thus, its direction, so that the internal light can no longer undergo the total internal reflection and can thus be extracted into the surrounding medium. In this technique, the large solid angle of the internal light improves the extraction efficiency of light.

A three-dimensional light wave simulation has revealed that the extraction efficiency of self-luminous devices featuring the above-described periodic structure is limited by the diffraction efficiency of the periodic structure: A significant amount of light is left trapped within LEDs. The three-dimensional light wave simulation is a known wave optics-based simulation technique developed by the present inventors (see Japanese Patent Application Laid-Open No. 2005-69709).

One problem of the periodic structure approach is that the structure may not be made with perfect periodicity depending on the type of the process used to make it. Such defective periodic structures cannot achieve sufficiently high light extraction efficiency. Also, making the periodic structure with perfect periodicity requires an elaborate process, which can add to cost.

One approach to improve the light extraction efficiency is to integrate the two-dimensional periodic structure into the light emitting layer (active layer). Although the integration of the two-dimensional periodic structure significantly improves the light extraction efficiency, the quality of the light emitting layer can significantly be affected. Thus, this approach still remains impractical.

Semiconductor surfaces containing broken bonds also contain various surface states and defects within the band gap. Carriers present near the semiconductor surface thus recombine through these surface states and defects (surface recombination). A two-dimensional periodic structure formed on the active layer creates on the processed surface a state similar to that seen on the surface in which bonds between crystals are broken. As a result, carriers injected into the active layer recombine at the surface, producing heat rather than light. This decreases the light conversion efficiency.

SUMMARY OF THE INVENTION

In view of the above-described and other problems, it is an object of the presently disclosed subject matter to effectively extract the light emitted from the illuminants to the surrounding medium, such as air.

It is another object of the present invention to improve the light extraction efficiency of light emitting devices without requiring elaborate processes.

It is still another object of the present invention to improve the light extraction efficiency of light emitting devices having a periodic structure with imperfect periodicity.

By using the above-described three-dimensional light wave simulation technique, the present inventors have analyzed the light emitted from LEDs and found that one of the key factors that affect the light extraction efficiency of an LED that has a two-dimensional periodic structure is the distribution of refractive indices in the semiconductor layers of the LED.

The present inventors have also found that the light extraction efficiency is also affected by the geometry of the two-dimensional periodic structure and the distance between the light emitting layer and the two-dimensional periodic structure. As used herein, the term "two-dimensional periodic structure" refers to any of the following periodic structures: triangular lattice, square lattice and hexagonal lattice, and quasicrystals that do not have translational symmetry, such as Penrose tiling and square-triangle tiling having a 12-fold symmetry, and combinations thereof.

The present inventors have also found that an intermediate layer having a refractive index lower than or equal to that of the active layer may be disposed within or adjacent to the two-dimensional periodic structure to further increase the light extraction efficiency. When combined with the asymmetric refractive index distribution of the semiconductor layers with respect to the active layer, the intermediate layer serves as a directional coupler that facilitates the coupling between the active layer and the two-dimensional periodic structure and thus increases the light extraction efficiency.

The light emitting device of the present invention facilitates extraction of light emitted by the illuminant by having the following two characteristic features: the above-described two-dimensional periodic structure formed in the surface of the device, and an asymmetric refractive index profile of the two layers on the sides of the active layer.

By using the above-described three-dimensional light wave simulation technique, the present inventors have analyzed the light emitted from LEDs and found that an intermediate layer having a refractive index lower than or equal to that of the active layer may be disposed within, or adjacent to, the two-dimensional periodic structure to further increase the light extraction efficiency. The intermediate layer serves as a directional coupler that facilitates the coupling between the active layer and the two-dimensional periodic structure and thus increases the light extraction efficiency.

The light emitting device of the present invention increases the efficiency of extraction of light emitted from the illuminant by including the two-dimensional periodic structure and the intermediate layer.

The light emitting device of the present invention includes a substrate layer with a first layer, an active layer and a second layer sequentially stacked on the substrate layer from the bottom up. The first layer includes single or multiple layers including a semiconductor cladding layer of a first conductivity type. The active layer is disposed above the first layer, and the second layer is disposed above the active layer. The second layer includes a semiconductor cladding layer of a second conductivity type. This layer includes a two-dimensional periodic structure on its surface and consists of single or multiple layers. The second layer serves to provide the surface of the device with the two-dimensional periodic structure.

In a preferred embodiment of the light emitting device of the present invention, the first layer includes at least one layer having a refractive index lower than that of the active layer and lower than that of one of the constituent layers of the second layer that is adjacent to the active layer. This construction establishes an asymmetric refractive index distribution in the upper and lower layers with respect to the interposed active layer.

In another preferred embodiment of the light emitting device of the present invention, the active layer may have a multiple quantum well structure. When the active layer has the multiple quantum well structure, the at least one layer of the first layer has a refractive index lower than that of the thickness-weighted-average of the refractive indices of the active layer and lower than that of the particular constituent layer of the second layer that is adjacent to the active layer.

The position of the two-dimensional periodic structure in the second layer is determined based on the refractive index n of the layer through which the light emitted by the active layer passes and the optical wavelength $\lambda$. Specifically, the two-dimensional periodic structure is situated such that the distance between the bottom of the two-dimensional periodic structure and the top of the active layer is in the range of 0.1 n$\lambda$ to n$\lambda$. n is the refractive index of the layer disposed between the bottom of the two-dimensional periodic structure and the top of the active layer. The refractive index is defined with respect to the wavelength of light in vacuum ($\lambda_0$). $\lambda$ is the optical wavelength of light in a medium.

In another preferred embodiment of the light emitting device of the present invention, an intermediate layer may be preferably disposed within the second layer. The intermediate layer has a refractive index lower than that of the active layer, but higher than that of any other constituent layer of the second layer. Thus, the refractive index of the intermediate layer is higher than that of the semiconductor cladding layer of the second conductivity type. When the active layer has a multiple quantum well structure comprising multiple well layers and barrier layers, the intermediate layer preferably has a refractive index lower than any of the well layers. Such an intermediate layer serves to further increase the light extraction efficiency of the light emitting device. The intermediate layer may be disposed within or between any constituent layer of the second layer as long as it is not arranged adjacent to the active layer.

A layer having a high reflectance (i.e., low refractive index) is preferably disposed on the substrate layer and adjacent to the first layer. This layer serves to further increase the light extraction efficiency of the light emitting device. Furthermore, a semiconductor multilayer structure grown on a temporary growth substrate may be laminated onto a separate support substrate with a metal layer or a reflective layer interposed between the multilayer structure and the support substrate. This facilitates the production of the light emitting device.

Materials such as GaN are difficult to grow on a substrate to form the semiconductor multilayer structure required to establish the asymmetric refractive index distribution. These materials may be first grown on a temporary growth substrate into a semiconductor layer, which in turn is laminated onto a separate support substrate. In this manner, the asymmetric refractive index distribution of the light emitting device can be established without compromising on the electric characteristics or the light emitting efficiency of the device.

The substrate layer of the light emitting device of the present invention may includes a substrate and a joint layer for joining the substrate to the first layer. When necessary, the first and second layers may each comprise a buffer layer, a contact layer or a current-diffusion layer. When the second layer includes the contact layer or the current-diffusion layer, the intermediate layer has a refractive index larger than that of the contact layer or the current-diffusion layer.

A transparent conductive film (ZnO (n=2), $TiO_2$, $Ta_2O_5$, ITO (n=1.8-1.9)) or a high refractive index resin layer may be deposited over the projections of the two-dimensional periodic structure of the second layer.

In another preferred embodiment of the light emitting device of the present invention, the second layer of the light emitting device of the present invention includes an intermediate layer having a refractive index lower than or equal to that of the active layer, but higher than that of any other constituent layer of the second layer. Such an intermediate layer serves to further increase the light emitting efficiency of the device. Thus, the refractive index of the intermediate layer is higher than that of the semiconductor cladding layer of the second conductivity type. When the active layer has a multiple quantum well structure comprising multiple well layers and barrier layers, the intermediate layer preferably has a refractive index lower than any of the well layers. The intermediate layer may be disposed within or between any constituent layer of the second layer as long as it is not arranged adjacent to the active layer. Furthermore, the intermediate layer may be provided within or in the vicinity of the two-dimensional periodic structure.

In the above-described preferred embodiment of the light emitting device of the present invention, the position of the two-dimensional periodic structure in the second layer is determined based on the refractive index n of the layer through which the light emitted by the active layer passes and the optical wavelength $\lambda$. Specifically, the two-dimensional periodic structure is situated such that the distance between the bottom of the two-dimensional periodic structure and the top of the active layer is in the range of 0.1 n$\lambda$ to n$\lambda$. n is the refractive index of the layer disposed between the bottom of the two-dimensional periodic structure and the top of the active layer. The refractive index is defined with respect to the wavelength of light in vacuum ($\lambda_0$). $\lambda$ is the optical wavelength of light in a medium.

In another preferred embodiment of the light emitting device of the present invention, the two layers on the sides of the active layer preferably has an asymmetric distribution of refractive index with respect to the interposed active layer. The asymmetric refractive index distribution increases the efficiency at which light emitted by the illuminant is extracted to the outside. What is meant by "asymmetric refractive index distribution with respect to the active layer" is that the first layer includes at least one layer that has a lower refractive index than the particular constituent layer of the second layer that is adjacent to the active layer.

In the above-described preferred embodiment, a layer having a high reflectance (i.e., low refractive index) is preferably disposed on the substrate layer and adjacent to the first layer. This layer serves to further increase the light extraction efficiency of the light emitting device. Furthermore, a semiconductor multilayer structure grown on a temporary growth substrate may be laminated onto a separate support substrate with a metal layer or a reflective layer disposed between the multilayer structure and the support substrate. This facilitates the production of the light emitting device.

The substrate layer of the light emitting device of the present invention may include a substrate and a joint layer for joining the substrate to the first layer. When necessary, the first and second layers may each comprise a buffer layer, a contact layer or a current-diffusion layer. When the second layer includes the contact layer or the current-diffusion layer, the intermediate layer has a refractive index larger than that of the contact layer or the current-diffusion layer.

Although the intermediate layer may be disposed within or between any constituent layer of the second layer, it is preferably not arranged adjacent to the active layer. The intermediate layer may be disposed on the substrate side of the bottom portion of the two-dimensional periodic structure or above the bottom portion of the two-dimensional periodic structure. The intermediate layer may contain the bottom portion.

A transparent conductive film (ZnO (n=2), $TiO_2$, $Ta_2O_5$, ITO (n=1.8-1.9)) or a high refractive index resin layer may be deposited over the projections of the two-dimensional periodic structure of the second layer.

As described above, the present invention enables the light emitted from an illuminant to be more efficiently extracted to the outside of a light emitting device. Furthermore, the present invention improves the light extraction efficiency of light emitting devices without requiring elaborate processes.

In addition, the present invention improves the light extraction efficiency of light emitting devices having a periodic structure with imperfect periodicity.

The LED of the present invention includes a first layer and a second layer stacked with an active layer in between. The second layer has a higher refractive index than the first layer, forming an asymmetric refractive index distribution. A two-dimensional periodic structure is formed in the surface of the second layer. Having such a construction, the LED of the present invention achieves an increased light extraction efficiency.

The LED of the present invention further includes an intermediate layer within or adjacent to the two-dimensional periodic structure. The intermediate layer has a refractive index lower than or equal to the active layer, and higher than any other constituent layer of the second layer. In this manner, the intermediate layer serves as a directional coupler that facilitates the coupling between the active layer and the two-dimensional periodic structure and thus increases the light extraction efficiency.

BRIEF DESCRIPTION OF THE DRAWINGS

These and other characteristics, features, and advantages of the presently disclosed subject-matter will become clear from the following description with reference to the accompanying drawings, wherein:

FIGS. 7A through 7F are diagrams showing the light extraction efficiencies for different constructions of the light emitting device of the present invention, each having a two-dimensional periodic structure (dense array of conical projections);

FIG. 15 is a diagram showing the light extraction effect of different AlGaInP-based LEDs of the present invention;

FIG. 17 is a diagram showing the light extraction effect of different GaN-based LEDs of the present invention;

DETAILED DESCRIPTION

A description will now be given of exemplary embodiments that are constructed in accordance with principles of the presently disclosed subject matter with reference to the accompanying drawings.

The self-luminous device of the present invention has been devised based on the knowledge obtained by a simulation conducted by using a medium having a particular refractive index.

Different AlGaInP-based devices and GaN-based devices were constructed based on the results of the simulation. The production processes and the light extraction efficiencies of these devices are described in the following.

Figure 1:
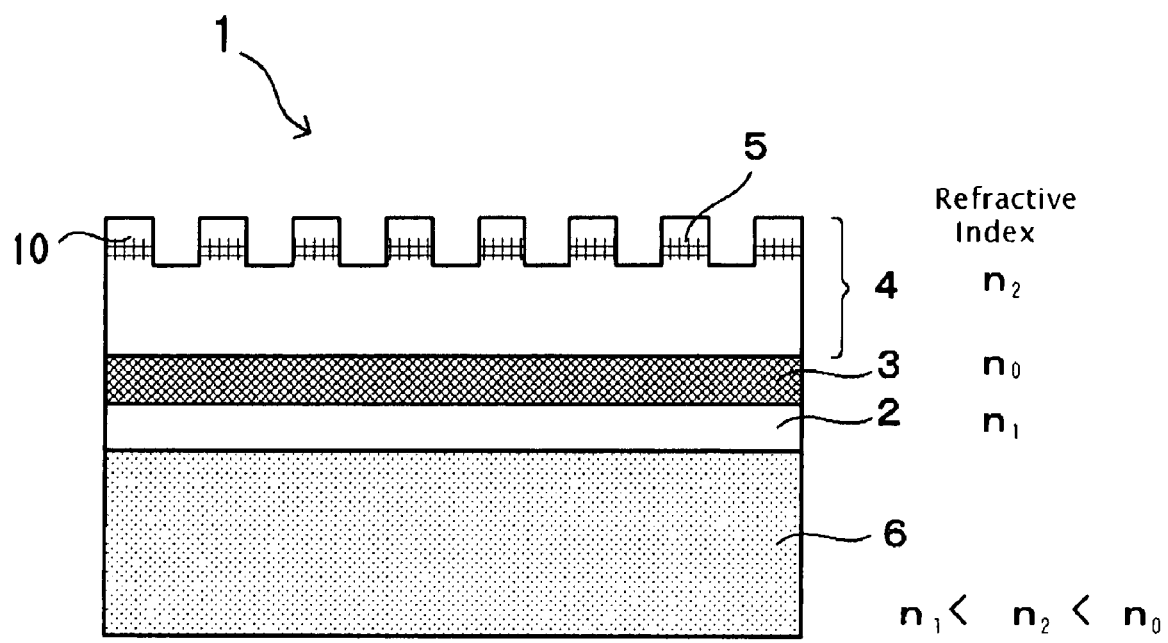
FIG. 1 is a diagram illustrating an exemplary construction of the light emitting device of the present invention.

Referring first to FIG. 1, an exemplary construction of the light emitting device of the present invention is shown in cross-section.

The construction of light emitting device 1 shown in FIG. 1 includes a two-dimensional periodic structure 10 on the side of the device from which light is extracted. Specifically, the light emitting device 1 includes, on a substrate layer 6, a first layer 2, an active layer 3 overlaying the first layer 2, and a second layer 4 overlaying the active layer 3. The two dimensional periodic structure 10 is formed either in the surface of the second layer 4 or in the surface of a layer overlaying the second layer 4. The refractive index of the second layer 4 ($n_2$) is higher than the refractive index of the first layer 2 ($n_1$) (i.e., $n_2 > n_1$). An intermediate layer 5 may further be disposed within the second layer 4. In FIG. 1, no represents the refractive index of the active layer 3.

The distance between the active layer 3 and the two-dimensional periodic structure 10 is preferably such that the distance between the top of the active layer 3 and the bottom of the two dimensional periodic structure 10 is in the range of $0.1\lambda_0$ to $\lambda_0$ ($0.1n\lambda$ to $n\lambda$) and is substantially the same as, or greater than, the penetration depth in the evanescent region, where $\lambda_0$ is the wavelength of light in vacuum and n is the refractive index of the semiconductor layer between the active layer 3 and the two-dimensional periodic layer 10.

This construction can be achieved by properly adjusting the composition of the first layer 2 and the second layer 4 during manufacturing of the light emitting device by, for example, metal organic chemical vapor deposition (MOCVD).

The construction in which the refractive index of the second layer is higher than that of the first layer makes the light distribution in the constituent layers of the light emitting device different from the light distribution in a light emitting device in which the refractive index distribution is symmetric with respect to the active layer. The improved light distribution facilitates the extraction of light trapped in the light emitting layer to the outside. The reason for this is as follows: Light extracted from the light emitting layer is guided to the second layer 4 that has a higher refractive index than the first layer 2. Furthermore, light emitted from the active layer 3 is strongly coupled to the two-dimensional periodic structure 10, so that the two-dimensional periodic structure 10 effectively contributes to the extraction of light.

This effect can be achieved not only when the medium surrounding the light emitting device 1 is air (n=1.00), but also when the light emitting device 1 is surrounded by another medium, such as resin (n=1.45).

In the light emitting device 1 of the present invention, the two-dimensional periodic structure 10 may be a dense array of circular pores or a dense array of cone-shaped projections and may be formed of photonic crystals or photonic quasicrystals. Cone-shaped projections such as conical projections, pyramidal projections or projections of any desired shape may be densely arrayed to form the dense array of cone-shaped projections.

The photonic crystals are formed by arranging regions of different refractive indices in a repetitive pattern with a period substantially equal to the wavelength of light. The photonic quasicrystals are formed by arranging, in accordance with a repetitive quasicrystal pattern, patterns of photonic crystals that have two types of regions having two different refractive indices in which the two regions alternately repeat with a period substantially equal to the wavelength of light. The photonic quasicrystals have a quasiperiodic structure of refractive index that does not have translational symmetry, but does have long-range order and rotational symmetry in terms of refractive index. The quasicrystals may form different patterns including a Penrose tiling (Penrose-type) pattern and a square-triangle tiling (12-fold symmetric) pattern.

The light emitting surface having a grating structure of photonic quasicrystals serves to increase the light extraction efficiency and decrease the dependency on the angle of view, allowing a large solid angle.

Figure 2A:
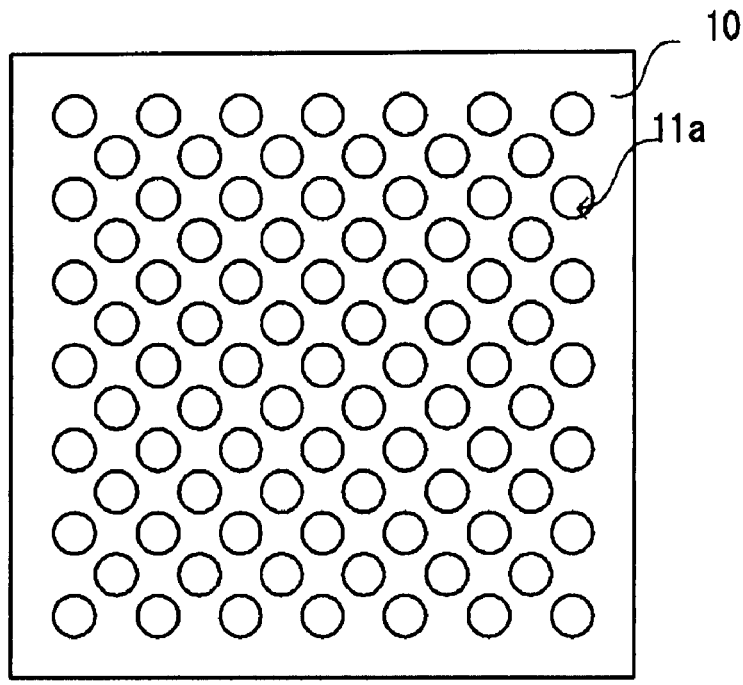
FIGS. 2A and 2B are a plan view and a side view, respectively, of a two-dimensional periodic structure of the present invention formed as a dense array of circular pores.
Figure 2B:
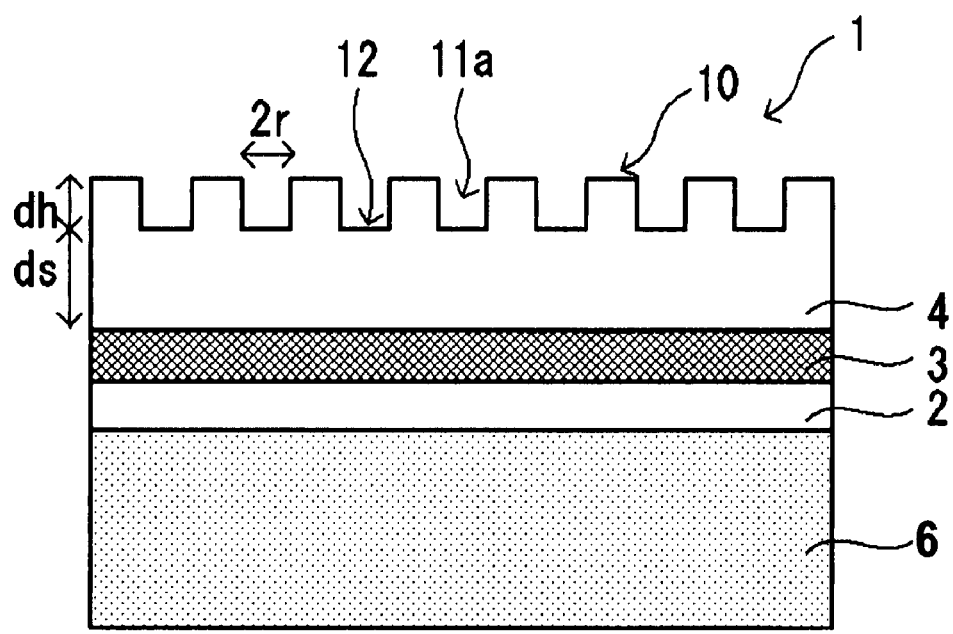

FIG. 2A is a plan view of the two-dimensional periodic structure 10 (i.e., dense array of circular pores) and FIG. 2B is a side view of the light emitting device 1 with the two-dimensional periodic structure 10.

The light emitting device 1 having this type of two-dimensional periodic structure (dense array of circular pores) includes circular pores 11a regularly arranged in an array on the second semiconductor layer 4. The diameter of each pore is given as 2r and the depth as dh. The distance between the bottom 12 of the circular pore 11a and the top of the light emitting layer 3 is indicated as ds. The two-dimensional periodic structure has a lattice constant a (i.e., pitch between pores) as a parameter that defines the structure.

The results of a three-dimensional light wave simulation have proven that the light extraction efficiency varies as a function of parameters a, 2r and dh: The efficiency maximizes when $a = n\lambda$ to $n1.5\lambda$, $2r = 0.5a$ to $0.6a$, and $dh = 0.5\lambda$ to $\lambda$, where n is the refractive index of the layer between the bottom of the two-dimensional periodic structure and the top of the active layer defined relative to the wavelength in vacuum ($\lambda_0$) and $\lambda$ is the optical wavelength in the medium.

Figure 3A:
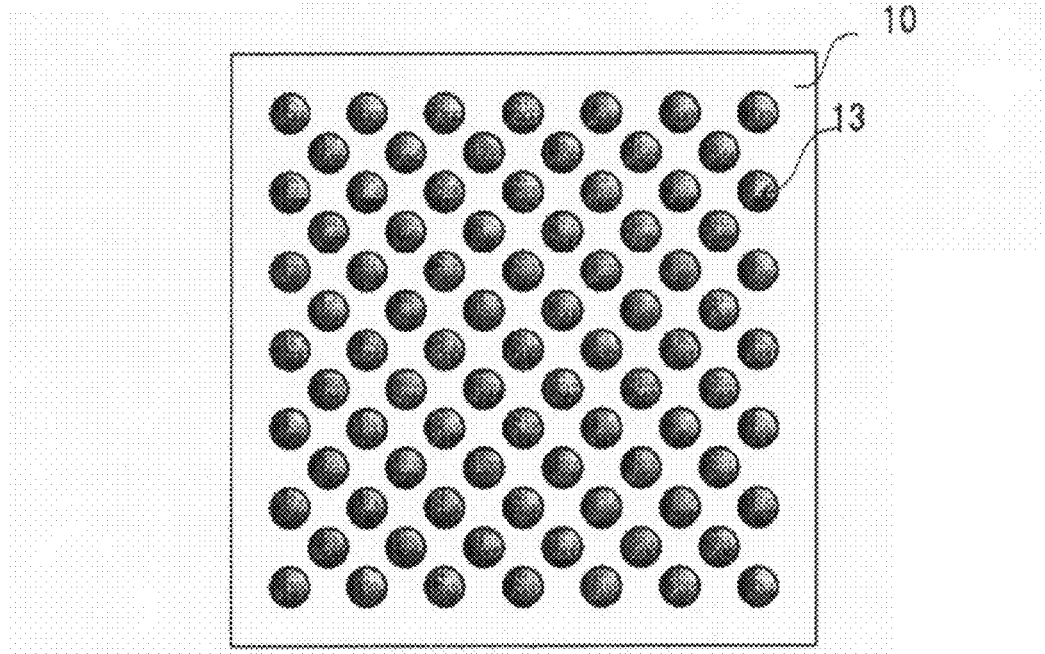
FIGS. 3A and 3B are a plan view and a side view, respectively, of a two-dimensional periodic structure of the present invention formed as a dense array of conical projections.
Figure 3B:
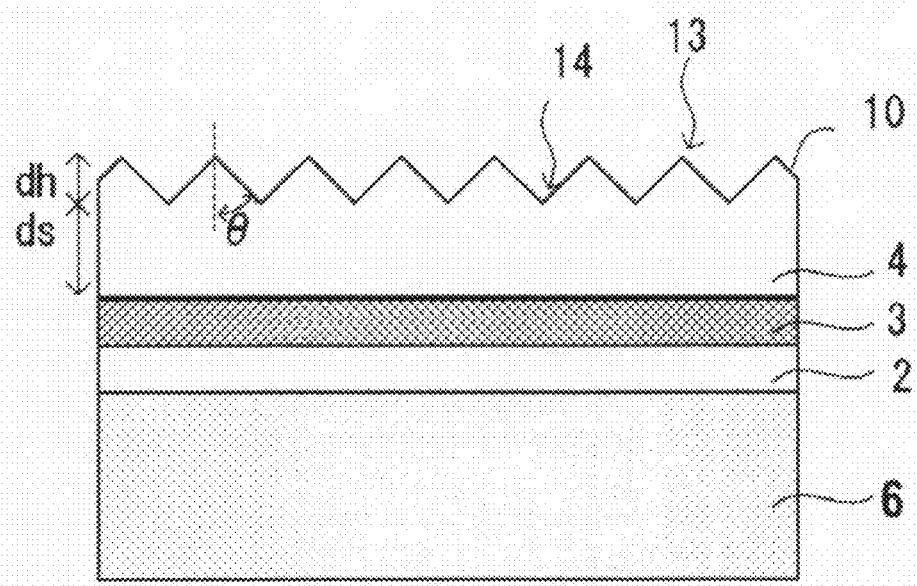
Figure 4A:
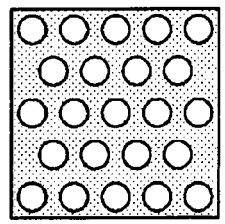
FIGS. 4A through 4I are diagrams showing the light extraction efficiencies for different constructions of the light emitting device of the present invention, each having a two-dimensional periodic structure (dense array of circular pores)
Figure 4B:
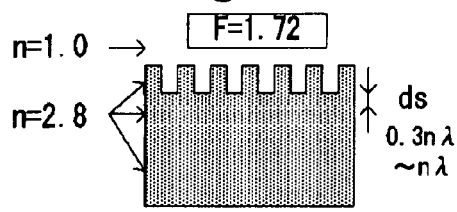
Figure 4F:
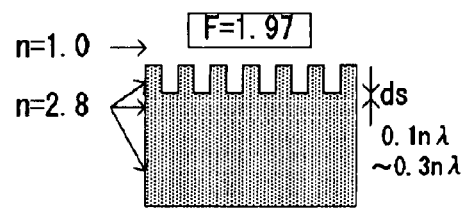
Figure 4C:
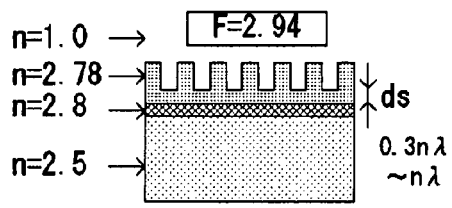
Figure 4G:
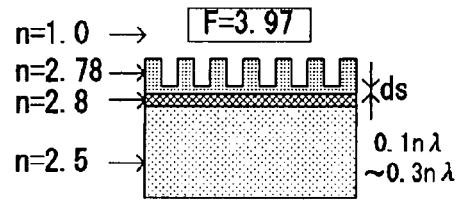
Figure 4D:
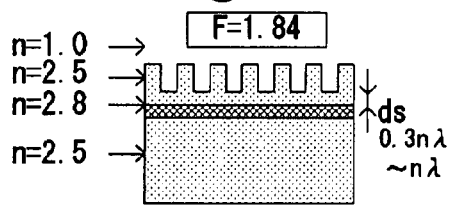
Figure 4H:
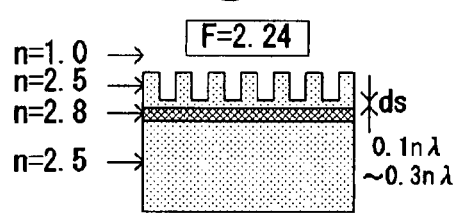
Figure 4E:
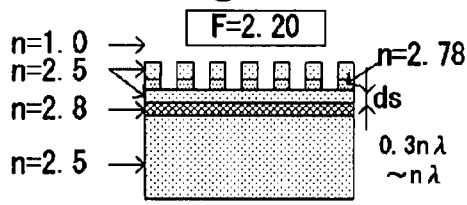
Figure 4I:
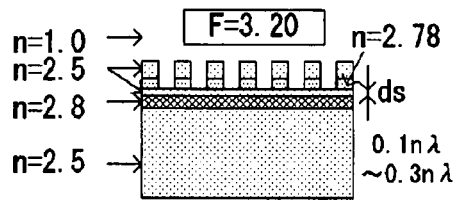
Figure 5A:
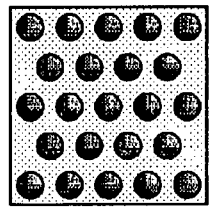
FIGS. 5A through 5I are diagrams showing the light extraction efficiencies for different constructions of the light emitting device of the present invention, each having a two-dimensional periodic structure (dense array of conical projections)
Figure 5B:
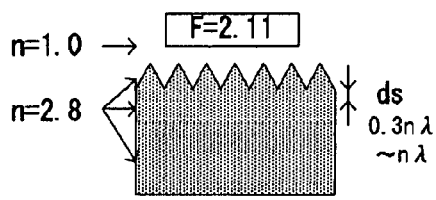
Figure 5F:
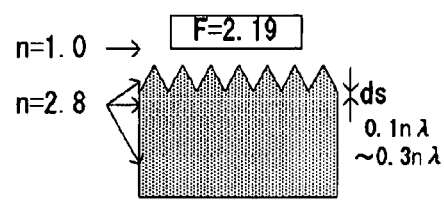
Figure 5C:
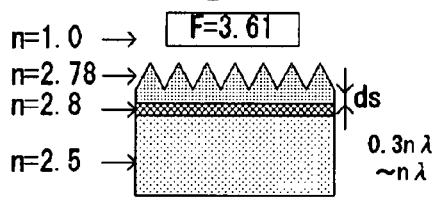
Figure 5G:
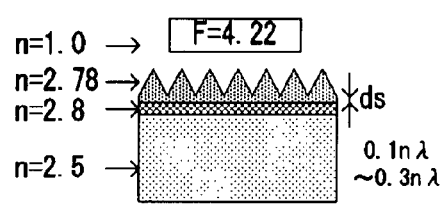
Figure 5D:
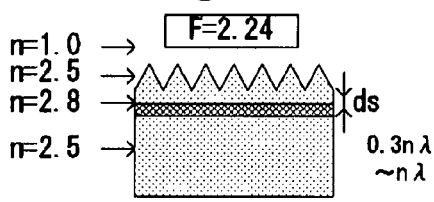
Figure 5H:
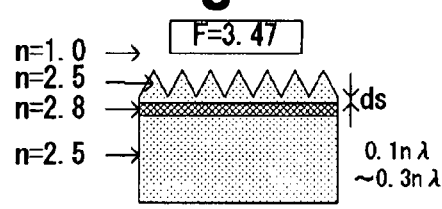
Figure 5E:
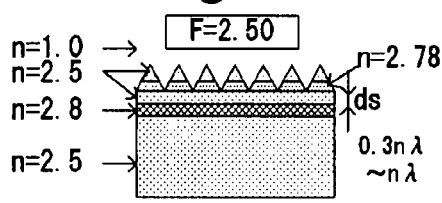
Figure 5I:
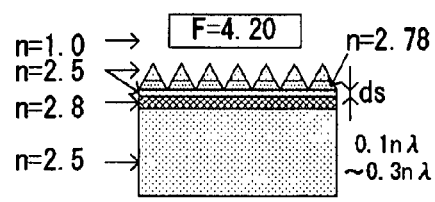
Figure 6A:
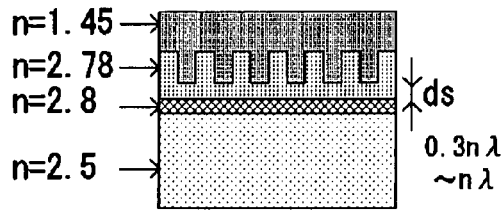
FIGS. 6A through 6F are diagrams showing the light extraction efficiencies for different constructions of the light emitting device of the present invention, each having a two-dimensional periodic structure (dense array of circular pores)
Figure 6D:
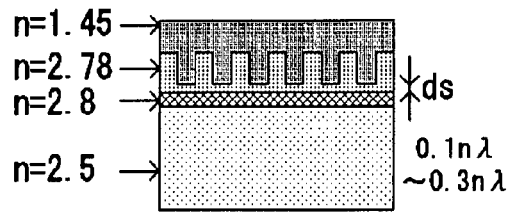
Figure 6B:
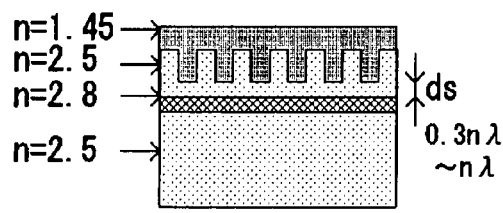
Figure 6E:
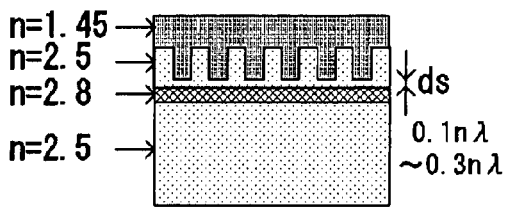
Figure 6C:
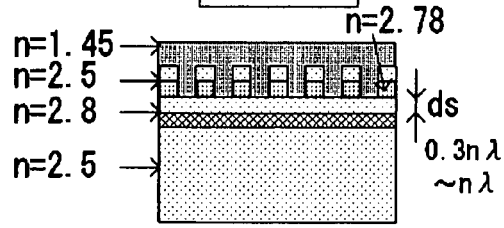
Figure 6F:
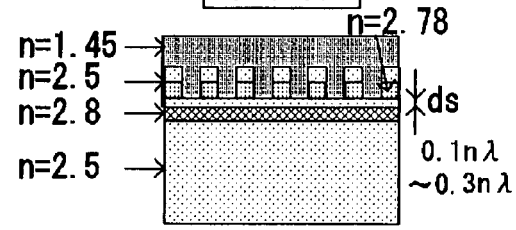

FIG. 3A is a plan view of the two-dimensional periodic structure 10 formed as a dense array of conical projections with FIG. 3B showing a side view of the light emitting device 1 and the two-dimensional periodic structure 10.

The light emitting device 1 having this type of two-dimensional periodic structure (dense array of conical projections) includes conical projections 13 regularly arranged in an array on the second semiconductor layer 4 (the light emitting surface is entirely covered with the conical projections). Each conical projection 13 has an angle θ (see FIG. 3B). The distance between the bottom 14 of the conical projection 13 and the top of the active layer 3 is indicated as ds. The two-dimensional periodic structure has a lattice constant a (i.e., pitch between conical projections). Each of the lattice constant a and the angle θ is a parameter that defines the structure.

The results of a three-dimensional light wave simulation have demonstrated that the light extraction efficiency varies as a function of parameters a and θ: The efficiency maximizes when a=0.5 n$\lambda$ to n$\lambda$, and θ=60° to 65° (n and $\lambda$ are as defined above).

Since the dependency of the lattice constant a on the light extraction efficiency is small, other surface structures may also be used to achieve comparable effects as long as the size of elements (such as pores and projections) and the degree of the density of the array (e.g., number of projections/pores per unit area) of such structures are not significantly different from those of the optimum array.

This suggests that the two-dimensional periodic structure does not have to be of high precision and can readily be fabricated by a simple process.

As will be described later, the light extraction efficiency of the light emitting device is determined relative to the standard (i.e., the light extraction efficiency of a flat surface self-luminous device that does not include any two-dimensional periodic structures).

The results of a three-dimensional light wave simulation have proven that the light extraction efficiency improves when the distance ds between the top of the active layer 3 and the bottom of the two-dimensional periodic structure 10 (i.e., the bottom 12 of the array of circular pores in FIG. 2B or the bottom 14 of the array of conical projections in FIG. 3B) is 0.1 n$\lambda$ to 0.3 n$\lambda$, or 0.3 n$\lambda$ to n$\lambda$ (n and $\lambda$ are as defined above).

When the distance between the top of the active layer and the bottom of the two-dimensional periodic structure is relatively large (ds=0.3 n$\lambda$ to n$\lambda$), the extraction of freely emitted internal light from the active layer 3 is increased, resulting in an increase in the light extraction efficiency.

When the distance between the top of the active layer and the bottom of the two-dimensional periodic structure is relatively small (ds=0.1n$\lambda$ to 0.3 n$\lambda$), it is varied so as to increase the light radiation and light extraction. This leads to an increase in the light extraction efficiency.

The two-dimensional periodic structure may be formed by transferring separately molded or cast projections onto a semiconductor substrate, or it may be formed by using epitaxial or other etching processes.

The formation of the two-dimensional periodic structure involves carving the two-dimensional periodic structure in the semiconductor layer. The semiconductor layer must be carved close to the active layer in the regions that correspond to the bottoms of the two-dimensional periodic structure. How deep the semiconductor layer must be carved depends on the distance ds. Thus, the active layer tends to be damaged during the processing when the distance ds between the top of the active layer and the bottom of the two-dimensional periodic structure is small.

The problem of damaging the light emitting layer during processing can be avoided without compromising on the light extraction efficiency by including the following features: the two-dimensional structure with the distance ds of 0.3 n$\lambda$ to n$\lambda$ (n and $\lambda$ are as defined above), the asymmetric refractive index distribution with respect to the active layer, and, if necessary, the intermediate layer. As will be described later with reference to FIGS. 4 through 7, the construction including the intermediate layer can achieve F 3.20, where F is defined as the ratio of light extraction efficiency relative to the standard (1.00) (i.e., light intensity extracted from a light emitting device that does not include the intermediate layer).

By conducting a three-dimensional light wave simulation, the light extraction efficiency was determined for different light emitting devices described above and the results are described below with reference to FIGS. 4 through 7. For each device, the light extraction efficiency was determined using as the standard the light intensity of a flat surface light emitting device that does not have any two-dimensional periodic structures.

For calculation, the following refractive indices were used. The refractive index of the active layer was 2.8. The refractive index of the first layer was 2.8 or 2.5. The refractive index of the second layer was 2.8, 2.78 or 2.5. The refractive index of the intermediate layer was 2.78. The thickness of the active layer was 0.2 n$\lambda$ (where $\lambda$ is the optical wavelength of light). The refractive index of air to which the light emitting surface was exposed was 1.0. The refractive index of the resin was 1.45.

Referring to FIGS. 4 and 5, the light extraction efficiency (F) is shown for different structures of the light emitting device having respective two-dimensional periodic structures. The light extraction efficiency of each structure was determined using as the standard the light extraction efficiency of the corresponding flat surface structure of the light emitting device that does not include two-dimensional periodic structures (1.00). The results were obtained based on the optimum ranges of parameters determined by the three-dimensional light wave simulation. For the light emitting devices shown in FIG. 4, each having a dense array of circular pores as the two-dimensional periodic structure as shown in FIG. 4A, the following parameters were used: a=1.5 n$\lambda$, 2r=0.6 a, and dh=n$\lambda$. For the light emitting devices shown in FIG. 5, each having a dense array of conical projections as the two-dimensional periodic structure as shown in FIG. 5A, the following parameters were used: a=0.5 n$\lambda$, and θ=63°.

Simulation was performed for each of the following structures that are shown in FIGS. 4 and 5 in schematic diagrams with their respective refractive indices: single layer structures (FIGS. 4B, 4F, 5B, and 5F), asymmetric structures with a varying refractive index (FIGS. 4C, 4G, 5C, and 5G), symmetric structures with the same refractive index (FIGS. 4D, 4H, 5D, and 5H), and intermediate layer structures having an intermediate layer within the second semiconductor layer (FIGS. 4E, 4I, 5E, and 5I). For each structure, two examples were shown that have different distances (ds) between the bottom of the two-dimensional periodic structure and the active layer: One with ds in the range of 0.3 n$\lambda$ to n$\lambda$ (FIGS. 4B to 4E and FIGS. 5B to 5E) and the other with ds in the range of 0.1 n$\lambda$ to 0.3 n$\lambda$ (FIGS. 4F to 4I and FIGS. 5F to 5I).

The results of the simulation analysis shown in FIGS. 4 and 5 are summarized in Table 1 below.

TABLE 1

| Structures | Flat surface | Surface feature | | | |
| --- | --- | --- | --- | --- | --- |
| | | Dense array of circular pores | | Dense array of conical projections | |
| | | ds (large) | ds (small) | ds (large) | ds (small) |
| Single layer | 1.00 | 1.72 | 1.79 | 2.11 | 2.19 |
| Asymmetric structure | 1.14 (1.00) | 2.94 (2.58) | 3.97 (3.48) | 3.61 (3.17) | 4.22 (3.70) |
| Symmetric structure | 1.02 (1.00) | 1.84 (1.80) | 2.24 (2.15) | 2.24 (2.20) | 3.47 (3.40) |
| Intermediate layer | 1.02 (1.00) | 2.20 (2.17) | 3.20 (3.14) | 2.50 (2.45) | 4.20 (4.11) |

The results indicate that the light extraction efficiency was similarly increased both in examples having a dense array of circular pores as the two-dimensional periodic structure and in corresponding examples having a dense array of conical projections. The increase in the light extraction efficiency was most significant in examples with the asymmetric layer structure, followed by examples with the intermediate layer structure. In each structure, the light extraction efficiency was higher in the example in which the distance ds between the bottom of the two-dimensional periodic structure and the active layer was smaller (0.1 n$\lambda$ to 0.3 n$\lambda$).

Referring to FIGS. 6 and 7, the light extraction efficiency (F) is shown for different structures of the light emitting device having respective two-dimensional periodic structures and having a resin coating on the light extraction side. The light extraction efficiency of each structure was determined using as the standard the light extraction efficiency of the corresponding flat surface structure of the light emitting device that does not include two-dimensional periodic structures (1.00). The results were obtained based on the optimum ranges of parameters determined by the three-dimensional light wave simulation. For the light emitting devices shown in FIG. 6, each having a dense array of circular pores as the two-dimensional periodic structure, the following parameters were used: a=1.5 n$\lambda$, 2r=0.6 a, and dh=n$\lambda$. For the light emitting devices shown in FIG. 7, each having a dense array of conical projections as the two-dimensional periodic structure, the following parameters were used: a=0.5 n$\lambda$, and $\theta$=63°.

Simulation was performed for each of the following structures that are shown in FIGS. 6 and 7 in schematic diagrams with their respective refractive indices: asymmetric structures with a varying refractive index (FIGS. 6A, 6D, 7A, and 7D), symmetric structures with the same refractive index (FIGS. 6B, 6D, 7B, and 7D), and intermediate layer structures having an intermediate layer within the second semiconductor layer (FIGS. 6C, 6F, 7C, and 7F). For each structure, two examples were shown that have different distances (ds) between the bottom of the two-dimensional periodic structure and the active layer: One with ds in the range of 0.3 n$\lambda$ to n$\lambda$ (FIGS. 6A to 6C and 7A to 7C) and the other with ds in the range of 0.1 n$\lambda$ to 0.3 n$\lambda$ ((FIGS. 6D to 6F and 7D to 7F).

The results of FIGS. 6 and 7 indicate that enhancement of the light extraction efficiency was observed in each of the resin coated structures (i.e., structures with two-dimensional periodic structure, structures with two-dimensional periodic structure and asymmetric refractive index distribution, and structures with two-dimensional periodic structure and intermediate layer). The light extraction efficiency was similarly increased both in examples having a dense array of circular pores as the two-dimensional periodic structure and in corresponding examples having a dense array of conical projections.

In the various structures described above, laser processing techniques in which recesses are formed by laser irradiation, etching techniques by which the semiconductor layer is etched by using a mask, and other techniques used in the production of semiconductor devices are used to form pores (openings) or recesses in the semiconductor parts.

The results of the simulation indicate that, for the light emitting devices having a periodic structure of conical projections, the light extraction efficiency decreases to half the maximum value when the size of the device is fixed and the lattice constant a is varied up to 6$\lambda$. This suggests that the scattering in each element and the diffraction caused by the periodicity of photonic crystals contribute to the light extraction efficiency to a similar extent.

Since the dependency of the lattice constant a on the light extraction efficiency is small, the photonic crystals significantly contribute to the light extraction efficiency. Other surface structures may also be used to achieve comparable effects as long as the size of elements and the degree of density of the array of such structures are not significantly different from those of the optimum dense arrays that have a local and periodic structure.

Although the first layer, the second layer and the active layer in the above-described structures each consist of a single layer, each layer may consist of multiple layers. Actual light emitting devices generally consist of multiple layers with different functions. Thus, the first layer and the second layer may each include a buffer layer, a contact layer or a current-diffusion layer and the active layer may have a multiple quantum well structure. The intermediate layer may be disposed either within any constituent layer of the second layer or between any two layers as long as it is not arranged adjacent to the active layer.

When the second layer consists of multiple layers, the first layer is designed to have a lower refractive index than the layer of the second layer adjacent to the active layer and the intermediate layer is not arranged adjacent to the active layer. When the active layer consists of multiple layers, the asymmetric refractive index distribution is designed as follows: Assuming the thickness-weighted-average of the refractive indices of the constituent layers of the active layer to be the refractive index of the active layer, the first layer and the second layer are each formed of a layer having a lower refractive index than the refractive index of the active layer. The reason for this is that when the active layer has a multiple quantum well structure, the light emission is affected by the average refractive index of the constituent layers, rather than by the individual refractive indices, because the thickness of the well layer or the barrier layer of the multiple quantum well structure (several nm) is less than one-tenth of the wavelength of the emission.

When the active layer has a multiple quantum well structure, the intermediate layer is preferably designed to have a refractive index lower than or equal to that of the well layer of the active layer. The intermediate layer preferably has a refractive index close to that of the active layer (above all, that of the well layer for the multiple quantum well structure). The reason for this is that while the intermediate layer having a greater refractive index is considered more effective in terms of the coupling with the two-dimensional periodic structure, it preferably is made of a material having a smaller band gap than the active layer, and thus having a refractive index lower than or equal to that of the active layer (above all, that of the well layer for the multiple quantum well structure).

A transparent conductive film (ZnO (n=2), TiO$_2$, Ta$_2$O$_5$, ITO (n=1.8-1.9)) or a high refractive index resin layer may be deposited over the projections of the two-dimensional periodic structure of the second layer.

Examples

The construction, the production process and the light extraction efficiency of the light emitting device of the present invention as determined by a simulation will now be described for exemplary light emitting devices using two different materials: AlGaInP and GaN.

Figure 8:
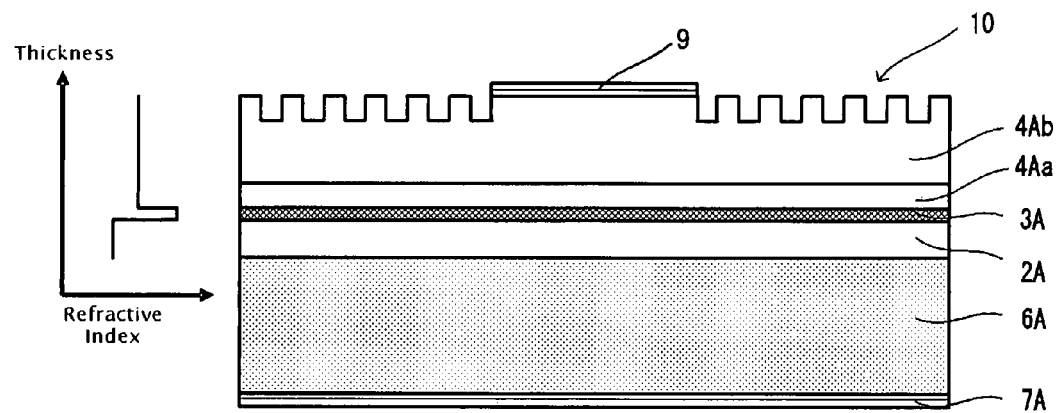
FIG. 8 is an illustrative diagram showing an AlGaInP-based LED of the present invention having a two-dimensional periodic structure and asymmetric refractive index feature.

Referring to FIG. 8, one construction of the light emitting device is shown that includes a two-dimensional periodic structure and a semiconductor layer that together form an asymmetric refractive index distribution with respect to the active layer in between. This construction is fabricated by stacking the following layers on a substrate layer 6A: a semiconductor cladding layer 2A of a first conductivity type (a first layer), an active layer 3A, a semiconductor cladding layer 4Aa of a second conductivity type, and a current-diffusion layer 4Ab (4Aa and 4Ab together form a second layer 4A). A two-dimensional periodic structure 10 is formed in the surface of the current-diffusion layer 4Ab. An electrode 7A is disposed below the substrate layer 6A, and an electrode 9 is disposed above the second layer 4A.

Figure 9:
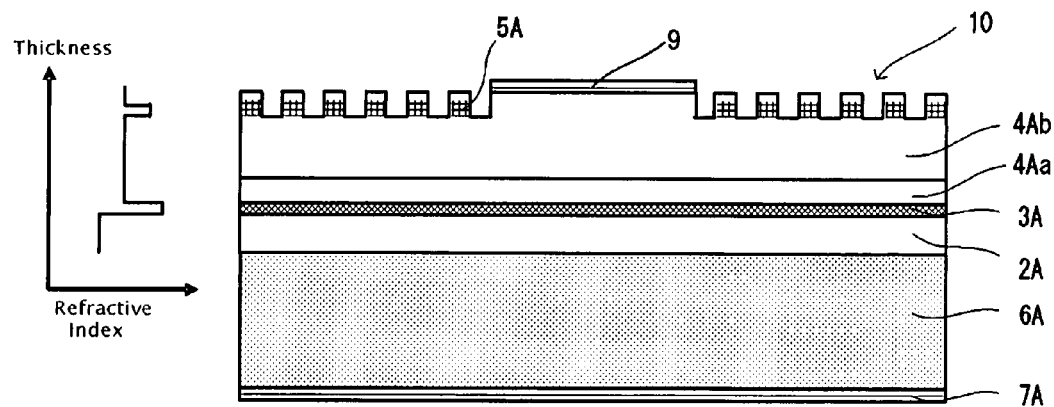
FIG. 9 is an illustrative diagram showing another AlGaInP-based LED of the present invention having a two-dimensional periodic structure, asymmetric refractive index feature and an intermediate layer.

Referring to FIG. 9, another construction of the light emitting device is shown that includes a two-dimensional periodic structure and a semiconductor layer that together form an asymmetric refractive index distribution with respect to the active layer in between, and an intermediate layer. This construction is essentially the construction of FIG. 8 with an intermediate layer 5A disposed within the second layer 4A. The intermediate layer 5A has a refractive index lower than or equal to that of the active layer 3A and higher than that of any of the other constitutive layers of the second layer 4A. The intermediate layer 5A within the second layer 4A may form part of the two-dimensional periodic structure 10, or it may form part of the second layer 4A other than the two-dimensional periodic structure 10.

Figure 10:
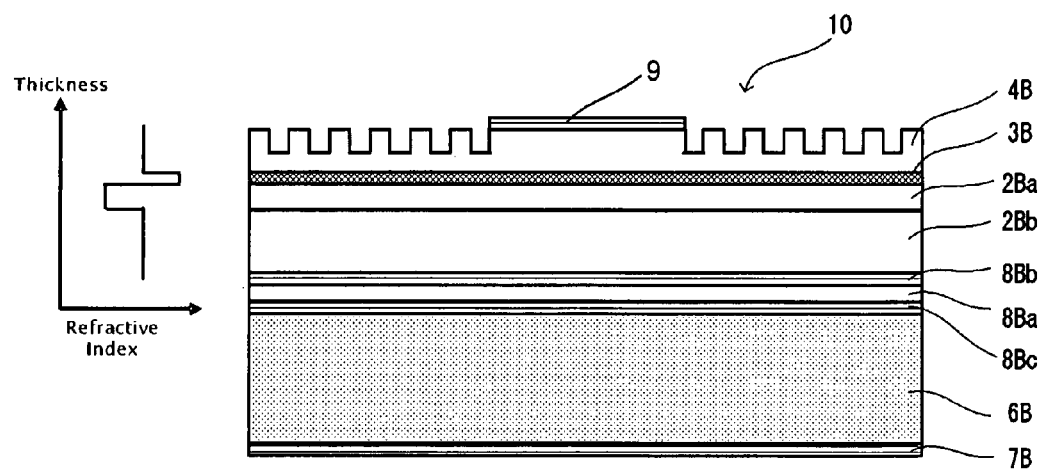
FIG. 10 is an illustrative diagram showing another AlGaInP-based LED of the present invention having a two-dimensional periodic structure and asymmetric refractive index feature.

Referring to FIG. 10, another construction of the light emitting device is shown. Similar to the construction of FIG. 8, this construction includes a two-dimensional periodic structure and a semiconductor layer that together form an asymmetric refractive index distribution with respect to the active layer in between. This construction differs from the construction of FIG. 8 in that electrodes 8Bb, 8Bc and a bonding layer 8Ba are disposed between the substrate and the semiconductor layer. This difference (i.e., the structure lying between the substrate and the semiconductor layer) comes from the difference in the production process: This construction is made by forming a semiconductor layer on a temporary growth substrate (which is removed later) and laminating the semiconductor layer on a separate permanent substrate, rather than by directly growing the semiconductor layer on the substrate. The second layer (the semiconductor cladding layer 4B of the second conductivity type), the active layer 3B and the first layer 2B (the current-diffusion layer 2Bb and the semiconductor cladding layer 2Ba of the first conductivity type) are grown on the temporary growth substrate (not shown). Subsequently, the electrode 8Bb and part of the bonding layer 8Ba are formed. Meanwhile, the electrode 8Bc and part of the bonding layer 8Ba are formed on the substrate 6B. The resulting two stacks are heat-bonded together with the bonding layers 8Ba facing each other. The temporary growth substrate is removed. The two-dimensional periodic structure 10 is then formed on the exposed surface of the semiconductor cladding layer 4B of the second conductivity type. The electrode 8Bb serves to form an Ohmic junction with the semiconductor layer and to reflect the light propagating from the active layer to the substrate before it reaches the substrate. The electrode 7B corresponds to the electrode 7A shown in FIGS. 8 and 9.

Figure 11:
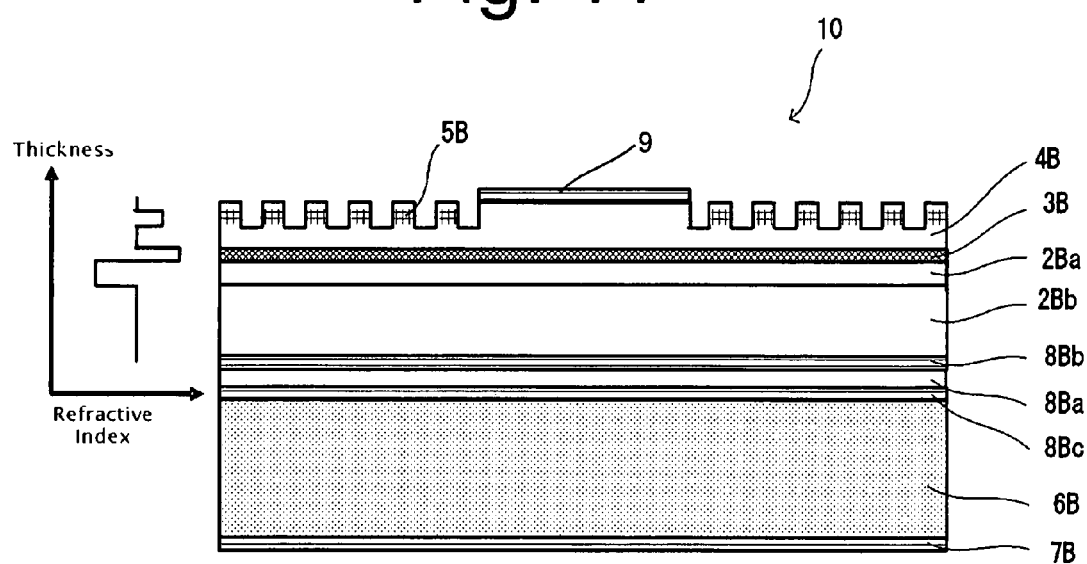
FIG. 11 is an illustrative diagram showing another AlGaInP-based LED of the present invention having a two-dimensional periodic structure, asymmetric refractive index feature and an intermediate layer.

Referring to FIG. 11, another construction of the light emitting device is shown. Similar to the construction of FIG. 9, this construction includes a two-dimensional periodic structure and a semiconductor layer that together form an asymmetric refractive index distribution with respect to the active layer in between, and an intermediate layer. This construction differs from the construction of FIG. 9 in what lies between the substrate and the semiconductor layer.

The construction of FIG. 11 includes an intermediate layer 5B within the second layer 4B. The intermediate layer 5B has a refractive index lower than or equal to that of the active layer 3B and higher than that of any of the other constitutive layers of the second layer 4B. The intermediate layer 5B within the second layer 4B may form part of the two-dimensional periodic structure 10, or it may form part of the second layer 4B other than the two-dimensional periodic structure 10. The other elements shown in FIG. 11 correspond to the structure described above with respect to FIG. 10.

Figure 12:
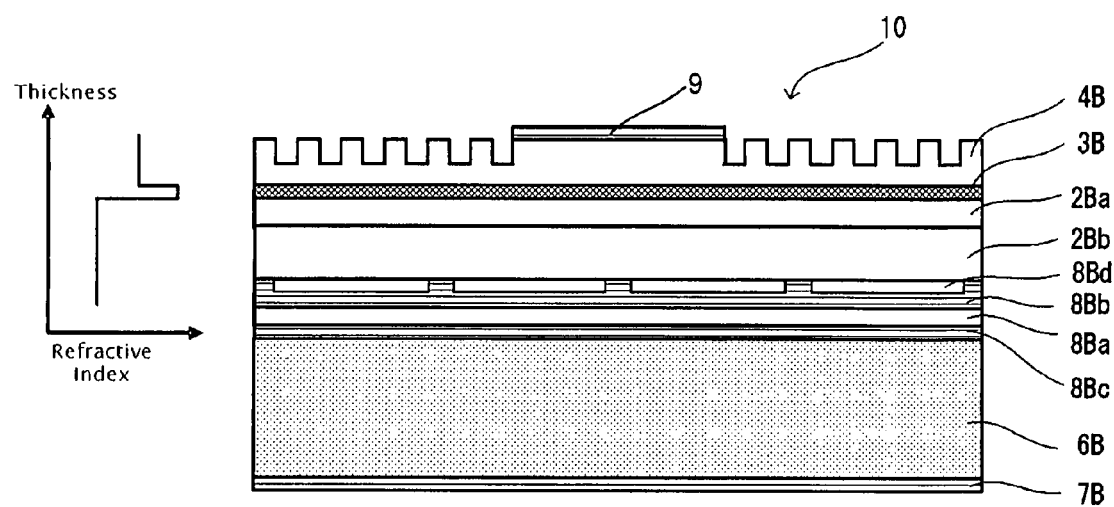
FIG. 12 is an illustrative diagram showing another AlGaInP-based LED of the present invention having a two-dimensional periodic structure and asymmetric refractive index feature.

Referring to FIG. 12, another construction of the light emitting device is shown. Similar to the construction of FIG. 10, this construction includes a two-dimensional periodic structure and a semiconductor layer that together form an asymmetric refractive index distribution with respect to the active layer in between. This construction differs from the construction of FIG. 10 in that a high reflectance layer 8Bd is disposed between the substrate and the semiconductor layer. The layer 8Bd, which has a higher reflectance than the electrode 8Bb in FIG. 10, serves to further increase the light extraction efficiency.

Examples of AlGaInP-based materials for the constituent layers of the constructions of FIGS. 8 and 9 are shown in Table 2 below, along with their refractive indices. Likewise, examples of materials for the constituent layers of the constructions of FIGS. 10, 11 and 12 are shown in Table 3 below, along with their refractive indices.

The refractive index of the active layer, which comprises the multiple quantum well structure, is the thickness-weight-average (3.41) of the refractive indices of the well layer (AlGaInP, z=0.15, thickness=20 nm, n=3.46) and the barrier layer (AlGaInP, z=0.56, thickness=10 nm, n=3.30).

TABLE 2

| | Constituent layers of LED | Materials (examples) | Refractive index ($\lambda_0$ = 640 nm) |
| --- | --- | --- | --- |
| Second layer | P-type current diffused layer | Zn doped GaP | 3.30 |
| | P-type cladding layer | Zn doped (Al$_{0.7}$Ga$_{0.3}$)$_{0.5}$In$_{0.5}$P | 3.26 |

TABLE 2-continued

| Constituent layers of LED | | Materials (examples) | Refractive index ($\lambda_0$ = 640 nm) |
|---|---|---|---|
| Intermediate layer | Intermediate layer | $(Al_{0.3}Ga_{0.7})_{0.5}In_{0.5}P$ Z = 0.3 | 3.39 |
| Active layer | Active layer | $(Al_zGa_{1-z})_{0.5}In_{0.5}P$ Well layer: z = 0.15, 20 nm Barrier layer: z = 0.56, 10 nm | Well layer: 3.46 Barrier layer: 3.30 Thickness-weighted-average: 3.41 |
| First layer | N-type cladding layer | Si doped AlInP z = 1.0 | 3.17 |
| | N-type buffer layer | Si doped GaAs | — |
| Substrate layer | Substrate | Si doped GaAs | — |

TABLE 3

| Constituent layers of LED | | Materials (examples) | Refractive index ($\lambda_0$ = 640 nm) |
|---|---|---|---|
| Second layer | N-type contact layer | Si doped $(Al_zGa_{1-z})_{0.5}In_{0.5}P$ | 3.26 |
| | N-type cladding layer | Si doped $(Al_zGa_{1-z})_{0.5}In_{0.5}P$ | 3.26 |
| Intermediate layer | Intermediate layer | Si doped $(Al_{0.3}Ga_{0.7})_{0.5}In_{0.5}P$ | 3.39 |
| Active layer | Active layer | Multiple quantum well structure $(Al_zGa_{1-z})_{0.5}In_{0.5}P$ Well layer: z = 0.15, 20 nm Barrier layer: z = 0.56, 10 nm | Well layer: 3.46 Barrier layer: 3.30 Thickness-weighted-average: 3.41 |
| First layer | P-type cladding layer | Zn doped $Al_{0.5}In_{0.5}P$ | 3.17 |
| | P-type current diffused layer | Zn doped GaP | 3.30 |
| Substrate layer | Reflective layer | $SiO_2$ | 1.45 |
| | P-type Ohmic layer | AuZn | — |
| | Bonding layer | AuSn | — |
| | Substrate | Si | — |

In the example shown in Table 2 above, the difference in the refractive index between the first layer and the second layer is 0.09 ($\Delta n$=0.09). In the example shown in Table 3 above, the difference in the refractive index between the first layer and the second layer is 0.1 ($\Delta n$=0.1). In Table 2, z in the general formula $(Al_zGa_{1-z})_{0.5}In_{0.5}P$ represents the proportion of Al composition. The proportion in the active layer is in the range of 0 to 0.7. The proportion in the first and the second layers is in the range of 0.5 to 1.0. The proportion in the intermediate layer is in the range of 0 to 0.6. Thus, the refractive index of the second layer is higher than that of the first layer while z of the second layer is lower than that of the first layer. Likewise, the refractive index of the active layer is higher than that of the intermediate layer while z of the active layer is lower than that of the intermediate layer.

Examples of the production processes of the light emitting device of the present invention are now described. Two different techniques are described in the following. In one technique, a semiconductor layer is directly grown on the substrate to make the constructions shown in FIGS. 8 and 9. In the other technique, a permanent substrate and a semiconductor layer are bonded together using, for example, metal bonding to make the constructions shown in FIGS. 10 through 12.

The first technique is described first. Specifically, the technique involves forming an AlGaInP-based semiconductor layer on a GaAs growth substrate.

Using the metal organic chemical vapor deposition (MOCVD) technique, an n-type cladding layer, an active layer, a p-type cladding layer, and a current-diffusion layer (CSL) for ensuring Ohmic contact with the electrode are sequentially grown on an n-type GaAs growth substrate. The n-type cladding layer is made of AlGaInP and the current-diffusion layer is made of GaP. In this example, the active layer having a composition of $(Al_zGa_{1-z})_{0.5}In_{0.5}P$ comprises a well layer (z=0.15, 20 nm) and a barrier layer (z=0.56, 10 nm). However, the Al composition (z) of the well layer and the barrier layer may be adjusted depending on the emission wavelength and may have any value within the range of 0<z<0.7.

The refractive index of the AlGaInP-based material having a composition of $(Al_zGa_{1-z})_{1-x}In_xP$ can be changed by adjusting x to 0.5 (x=0.5) and changing the Al composition (z) so as to ensure lattice alignment with the GaAs substrate.

In this example, the n-type cladding layer (z=1.0), the p-type cladding layer (z=0.7) and the CSL are each made of GaP in consideration of containment of electrons/holes by band offset and refractive index. In this case, the n-type cladding layer serves as the first layer and the p-type cladding layer and the CSL together serve as the second layer. The first and the second layers have refractive indices of 3.17 and 3.26, respectively.

When an intermediate layer is introduced, an AlGaInP layer with its Al composition z adjusted to 0.3 (z=0.3) is inserted between the p-type cladding layer and the CSL. The Al composition is adjusted such that the intermediate layer has a higher refractive index than the CSL and does not absorb the light emitted from the active layer.

Since the lattice constant of GaP used to make the current-diffusion layer differs from that of GaAs by about 3%, GaP cannot form a layer of single crystals with high crystallinity due to poor lattice alignment. However, the crystallinity of the current-diffusion layer can be negligible since the current-diffusion layer is grown after the active layer is stacked and is acceptable as long as it is transparent to the light color, has electrical conductivity, and can form an Ohmic contact with a gold alloy. In practice, the current-diffusion layer of sufficient quality can be produced by growing the crystals at temperatures 50 to 100° C. higher than the growth temperature of AlGaInP. AlGaAs also allows formation of an Ohmic contact with gold alloy and may also be used in the current-diffusion layer.

Following the growth by MOCVD, a two-dimensional periodic structure is formed on the CSL. As used herein, the term "two-dimensional periodic structure" refers to any of the following periodic structures: triangular lattice, square lattice and hexagonal lattice, and quasicrystals that do not have translational symmetry, such as Penrose tiling and square-triangle tiling having a 12-fold symmetry.

In the example, a two-dimensional periodic structure arranged in an array of circular pores forming a triangular lattice is formed on the CSL serving as the second layer. The two-dimensional periodic structure has a period of 1000 nm (a), a radius of the circular pore of 300 nm (r), a depth of 600 nm (d), and the distance from the active layer of 600 nm (h).

The two-dimensional periodic structure of a desired geometry can be formed by forming a resist pattern on the surface of the CSL by techniques such as photolithography, electron beam drawing, nanoimprinting and interference exposure, followed by wet-etching or dry-etching. Alternatively, the two-dimensional periodic structure may be formed by forming an $SiO_2$ pattern by any of the above-described techniques and growing the pattern by MOCVD.

The electrode for supplying current is formed on the bottom side of the GaAs substrate and the top side of the CLS by vacuum deposition, sputtering, and electron beam deposition. Specifically, the electrode on the bottom side of the GaAs substrate is made of an alloy of gold, germanium and nickel and the electrode on the top side of the CSL is made of an alloy of gold and zinc. The electrode for supplying current to the LED may be formed either before or after the formation of a two-dimensional periodic structure.

Figure 13:
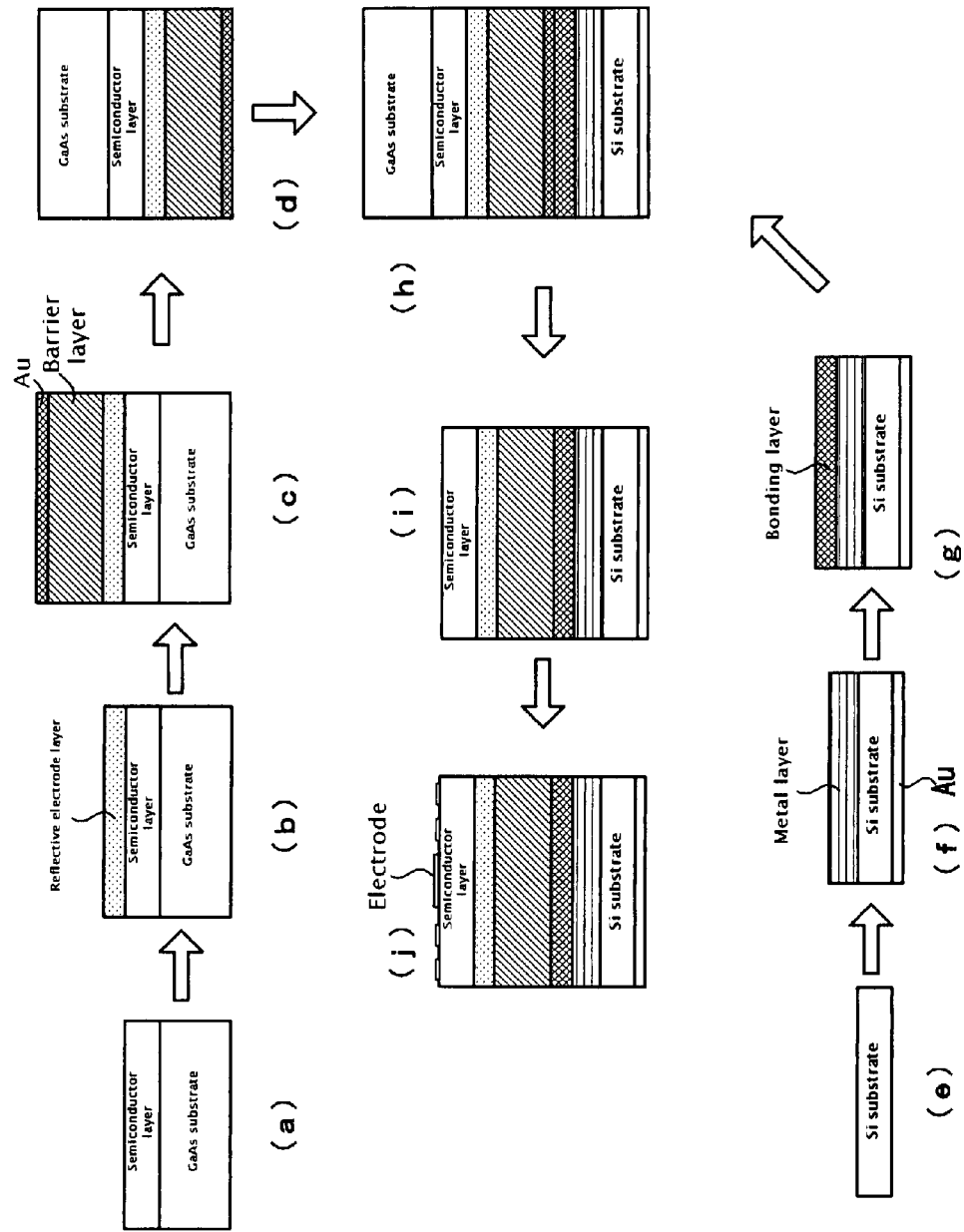
FIG. 13 is an illustrative diagram schematically showing a process for forming a semiconductor layer on a permanent substrate layer by metal bonding.

Referring next to FIG. 13, the second technique is described next. This technique involves metal-bonding of an AlGaInP-based LED formed on a permanent substrate (Si) layer.

Briefly, a semiconductor layer of AlGaInP-based material is grown on a GaAs substrate, or a temporary substrate. The semiconductor layer is then metal-bonded to a separate Si substrate via a bonding layer. Subsequently, GaAs is removed.

In FIG. 13, (a) through (d) show a process for forming the semiconductor layer. A process for forming the substrate layer is shown by (e)_through (g) in FIG. 13. And (h) through (j) in FIG. 13 show a process for bonding the semiconductor layer to the substrate layer.

In the process for forming the semiconductor layer, the semiconductor layer is first formed on the GaAs substrate ((a) in FIG. 13). A reflective electrode layer is then formed on the semiconductor layer ((b) in FIG. 13). A barrier layer and an Au metal layer are then sequentially formed on the reflective electrode layer ((c) in FIG. 13). The resulting stack of the layers is then turned upside down ((d)). The semiconductor layer comprises the above-described first layer, active layer and second layer (not shown). Specifically, an n-type cladding layer, an active layer, a p-type cladding layer and a current-diffusion layer (CSL) are sequentially grown on an n-type GaAs growth substrate ((a) and (b) in FIG. 13) by MOCVD. The n-type cladding layer is made of AlGaInP and the current-diffusion layer is made of GaP. In this example, the n-type cladding layer arranged on the side of the LED from which light is extracted has a refractive index of 3.26 (z 0.7) and the p-type cladding layer has a refractive index of 3.17 (z=1.0). In this example, the active layer having a composition of $(Al_zGa_{1-z})_{0.5}In_{0.5}P$ comprises a well layer (z=0.15, 20 nm) and a barrier layer (z=0.56, 10 nm). However, the Al composition (z) of the well layer and the barrier layer may be adjusted as desired and may have any value within the range of 0<z<0.7.

When an intermediate layer is introduced, an AlGaInP layer with its Al composition adjusted (e.g., 0.3) is introduced within the n-type cladding layer. The Al composition is adjusted such that the intermediate layer has a higher refractive index than the n-type cladding layer and does not absorb the light emitted from the active layer.

After the constituent layers of the semiconductor layer have been grown by MOCVD, a layer of an AuZn alloy is deposited (to a thickness of 3000 angstrom) on the surface of the CSL by, for example, sputtering to form a reflective electrode layer that ensures electrical connection of the CSL to the semiconductor crystals ((b) in FIG. 13). A layer of Au is then deposited (to a thickness of 3000 angstrom) to serve as a barrier layer that ensures electrical connection and close contact with AuSn ((c) in FIG. 13). In fabricating a construction as shown in FIG. 12 that comprises a semiconductor layer, a substrate layer and a reflective layer, a layer of high reflectance material such as $SiO_2$ is first formed over part of the current-diffusion layer. Other layers, such as an AuZn electrode layer, a barrier layer and a close contact layer (Au), are then formed.

In the process for forming the substrate layer, AuSn is deposited on, for example, an Si permanent substrate (a metal layer and a bonding layer shown in FIG. 13 at (f) and (g), respectively). The stack prepared above ((d) in FIG. 13) is then placed on the permanent substrate over the AuSn layer with the Au layer of the stack facing the AuSn layer. The stacks are bonded together by heating and pressing. The molten AuSn serves to bond the stack made by MOCVD to the permanent substrate ((h) in FIG. 13). In the resulting construction, the permanent substrate serves to maintain mechanical strength of the LED structure after the growth substrate has been removed and provide electrical connection with the electrodes.

After the stack has been bonded to the permanent substrate, the GaAs growth substrate is removed by an etchant composed of ammonia and hydrogen peroxide ((i) in FIG. 13). Subsequently, a two-dimensional periodic structure is formed on the n-type cladding layer (not shown). The structure and production process of the two-dimensional periodic structure are as described above.

The foregoing metal-bonding process is just an example: Other approaches are also possible. For example, the semiconductor stack may not be turned upside down, or the stacks may be bonded together without forming the metal layer or bonding layer.

A light wave optics simulation was conducted on the above-described AlGaInP-based LED. The results are described in the following. Parameters of the two-dimensional periodic structure used in the light wave optics simulation of the AlGaInP-based LED are shown in Table 4 below.

Figure 14:
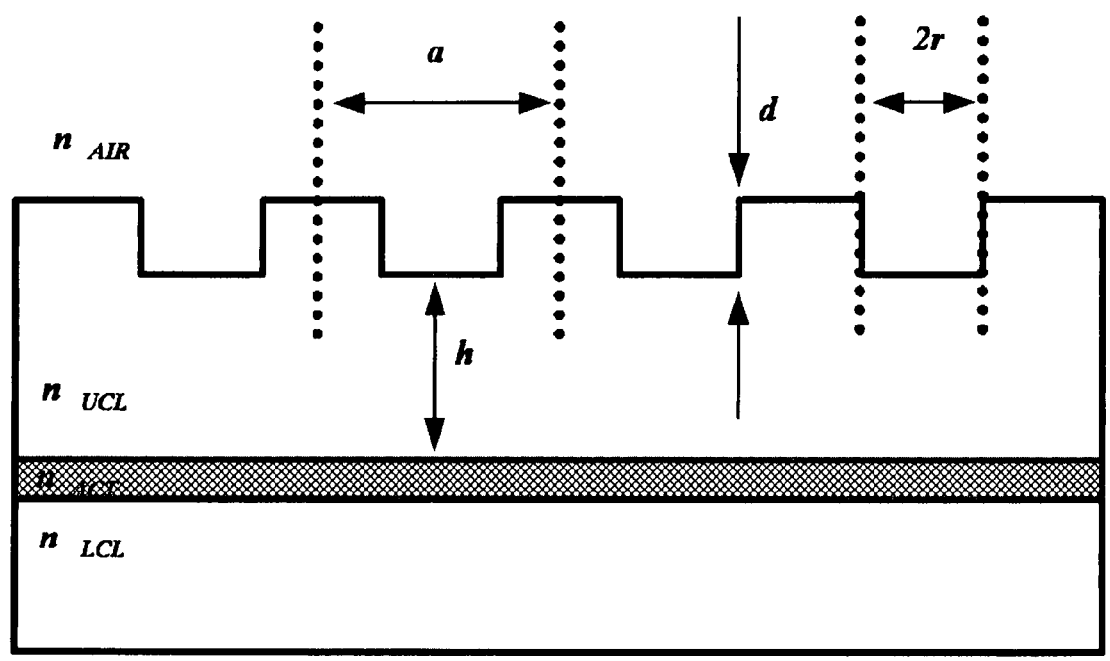
FIG. 14 is an illustrative diagram showing the dimensions of a two-dimensional periodic structure as determined by a simulation of an AlGaInP-based LED of the present invention.

The parameters of the simulation are also shown in FIG. 14. In the light wave optics simulation, the emission wavelength $\lambda_0$ (in vacuum) is 640 nm, the excitation method is incoherent, the time step is 0.03 fs, and the cell size is 20 nm×20 nm×20 nm.

TABLE 4

Parameters of two-dimensional periodic structure

| Parameters | Assigned letters | Value | Unit |
|---|---|---|---|
| Arrangement | — | Triangular lattice | — |
| Geometry | — | Circular pores | — |
| Pitch | a | 1000 | nm |
| Radius | r | 300 | nm |
| Depth | d | 600 | nm |
| Distance from the active layer | h | 100, 200, 600, 1000 | nm |

The light extraction efficiencies of different constructions shown in FIG. 15 are compared in FIG. 15. The constructions are as follows: A construction with no two-dimensional periodic structure having a symmetric refractive index distribution with respect to the active layer (referred to as "basic structure" or "planar symmetric" hereinafter); a construction with no two-dimensional periodic structure having an asymmetric refractive index distribution with respect to the active layer (referred to as "planar asymmetric" hereinafter); a construction with a two-dimensional periodic structure having a symmetric refractive index distribution with respect to the active layer (referred to as "two-dimensional periodic and symmetric" hereinafter); a construction with a two-dimensional periodic structure that has a symmetric refractive index distribution with respect to the active layer and an intermediate layer (referred to as "two-dimensional periodic, symmetric and intermediate layer" hereinafter); a construction with a two-dimensional periodic structure having an asymmetric refractive index distribution with respect to the active layer (referred to as "two-dimensional periodic and asymmetric" hereinafter); and a construction with a two-dimensional periodic structure that has an asymmetric refractive index distribution with respect to the active layer and an intermediate layer (referred to as "two-dimensional periodic, asymmetric and intermediate layer" hereinafter). For the structures having an asymmetric refractive index distribution with respect to the active layer, the refractive indices of the first layer, the active layer, the second layer and the intermediate layer are 3.17, 3.41, 3.26 and 3.39, respectively. In each simulation, it is assumed that $\lambda_0$=640 nm.

Figure 16:
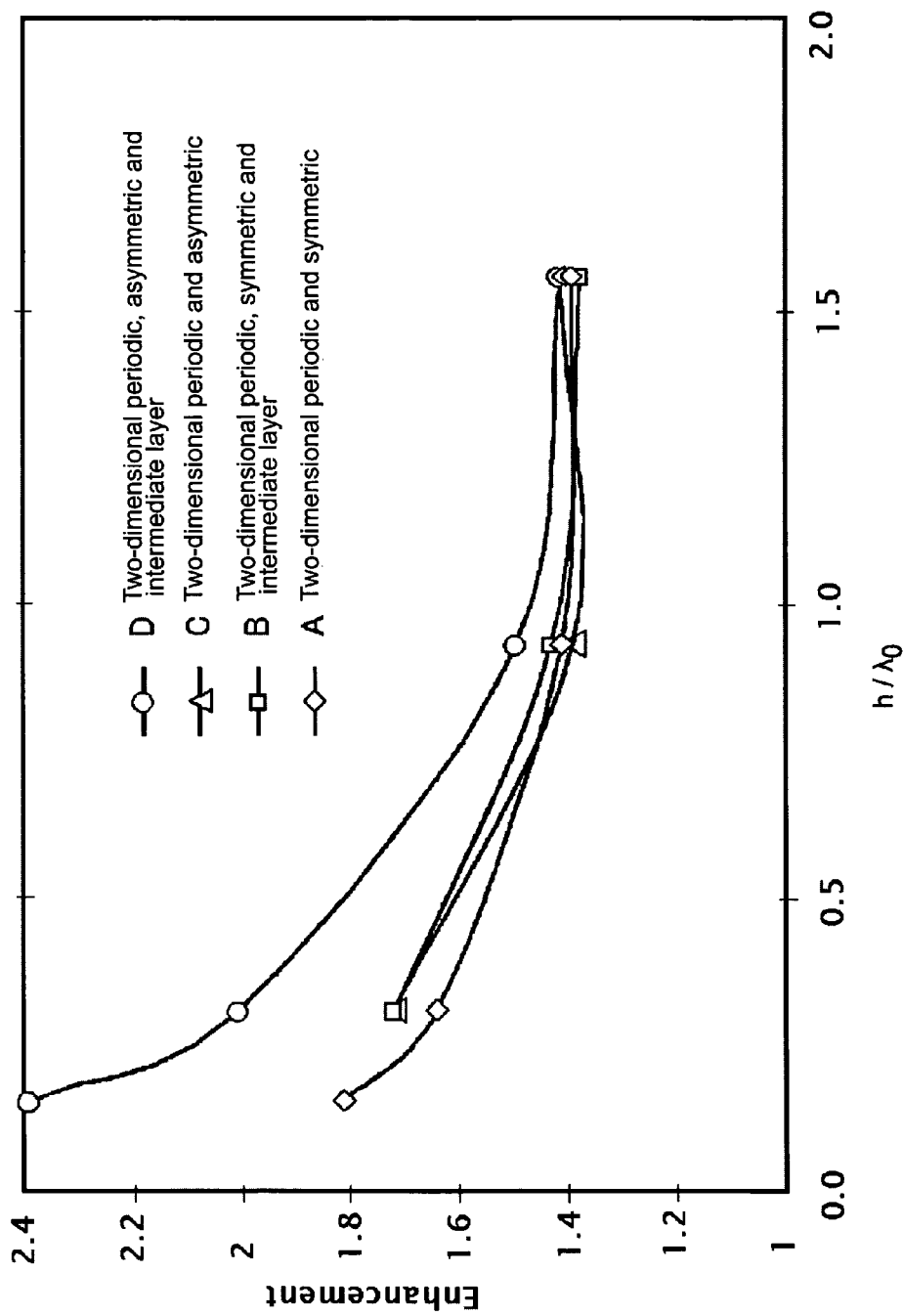
FIG. 16 is a graph showing the light extraction effect of different AlGaInP-based LEDs of the present invention.

FIGS. 15 and 16 show the light extraction efficiency of different AlGaInP-based LEDs.

FIG. 15 shows light extraction efficiencies of different constructions of the AlGaInP-based LED relative to the standard (i.e., light intensity obtained by "planar symmetric" construction (=1.00)).

FIG. 16 shows the relationship between the ratio of the light intensity of each construction to the light intensity of the basic structure and the ratio $h/\lambda_0$, where h is the distance between the bottom of the two-dimensional periodic structure and the active layer and $\lambda_0$ is the emission wavelength (in vacuum) (640 nm in FIGS. 15 and 16).

The signs A, B, C and D in FIG. 16 represent the "two-dimensional periodic and symmetric," "two-dimensional periodic, symmetric and intermediate layer," "two-dimensional periodic and asymmetric," and "two-dimensional periodic, asymmetric and intermediate layer," respectively.

The results of the simulation shown in FIGS. 15 and 16, in particular the comparison of A and C, indicate that the construction having the two-dimensional periodic structure and the asymmetric refractive index distribution has an increased light extraction efficiency when the ratio of the distance h to the wavelength ($h/\lambda_0$) is relatively small. The results also indicate that the light extraction efficiency of this construction increases as the value of $h/\lambda_0$ decreases.

It is also observed that the construction having the two-dimensional periodic structure, the asymmetric refractive index distribution and the intermediate layer has an increased light extraction efficiency.

When the distance h between the active layer and the two-dimensional periodic structure is smaller than $\lambda_0$, the light extraction efficiency is higher than the "planar symmetric" in each of "two-dimensional periodic and symmetric," "two-dimensional periodic, symmetric and intermediate layer," "two-dimensional periodic and asymmetric," and "two-dimensional periodic, asymmetric and intermediate layer." When the value of $h/\lambda_0$ is 1, h equals $n\lambda$. Thus, the light extraction efficiency increases when the distance between the active layer and the two-dimensional periodic structure is smaller than or equal to $n\lambda$. Particularly high light extraction efficiency is observed in "two-dimensional periodic, symmetric and intermediate layer" and "two-dimensional periodic, asymmetric and intermediate layer." These observations indicate that the intermediate layer serves as a directional coupler that facilitates the coupling between the active layer and the two-dimensional periodic structure. Particularly high light extraction efficiency is observed in "two-dimensional periodic, asymmetric and intermediate layer."

The reason that the light extraction efficiency for "two-dimensional periodic, asymmetric and intermediate layer" is higher than anticipated from the results obtained for "two-dimensional periodic, symmetric and intermediate layer" and "two-dimensional periodic and asymmetric" is considered to be as follows: Of all of the light that is guided through the light extraction surface and the active layer, the light guided to the light extraction surface is coupled to the two-dimensional periodic structure and is extracted due to the formation of the asymmetric refractive index distribution whereas the light guided through the active layer is coupled to the two-dimensional periodic structure via the intermediate layer and is then extracted.

While the intermediate layer has a refractive index lower than or equal to that of the active layer and higher than that of any of the constitutive layers of the second layer, it may have a refractive index substantially the same as that of the active layer.

When a two-dimensional periodic structure is formed on the active layer, the efficiency of the light emitting device significantly decreases due to the surface recombination. However, by disposing an intermediate layer having a refractive index substantially the same as that of the active layer either within or adjacent to the two-dimensional periodic structure, the intermediate layer serves as a directional coupler that facilitates the coupling between the active layer and the two-dimensional periodic structure and thus increases the light extraction efficiency. The intermediate layer prevents the decrease in the efficiency caused by the surface recombination. It also eliminates the need to form a deep two-dimensional periodic structure reaching the active layer and therefore facilitates the production process.

Exemplary constructions of the GaN-based LED are now described. Since GaN-based LEDs have essentially the same structure as the above-described AlGaInP-based LEDs, the exemplary constructions are described with reference to FIGS. 10 through 12.

The substrate 6B, the current-diffusion layer (CSL) 2Bb of the first layer 2B, the semiconductor cladding layer 2Ba of the first conductivity type (p-type cladding layer), the active layer 3B, and the semiconductor cladding layer 4B of the second conductivity type (n-type cladding layer) are formed of Si, GaN, AlGaN, InGaN and GaN, respectively.

Examples of materials for the constituent layers of a GaN-LED are shown in Table 5 below, along with their refractive indices.

The refractive index of the active layer, which comprises the multiple quantum well structure, is the thickness-weight-average (n=2.53) of the refractive indices of the well layer ($In_xGa_{1-x}N$, x=0.4, thickness=2 nm, n=2.75) and the barrier layer (GaN, thickness=14 nm, n=2.50).

In this example, the refractive indices of the n-type cladding layer (GaN), the active layer (InGaN) and n-AlGaN (Al composition is adjusted to 40% without affecting the quality of the crystals) are 2.50, 2.53, 2.40, respectively. In this composition, the difference in the refractive index between the first layer and the second layer is 0.1 ($\Delta n=0.1$).

When an intermediate layer is introduced, an InGaN layer with its In composition adjusted is inserted in the n-type cladding layer. The In composition is adjusted such that the intermediate layer has a higher refractive index than the n-type cladding layer. In this example, the intermediate layer has a refractive index of 2.55.

After growth by MOCVD, a layer of a Pt/Ag alloy is deposited (to a thickness of 3000 angstrom) on the surface of the p-type cladding layer by, for example, sputtering to ensure electrical connection to the semiconductor crystals. A layer of Ta, Au is then deposited (to a thickness of 3000 angstrom) to

TABLE 5

| | Constituent layers of LED | Materials (examples) | Refractive index ($\lambda_0 = 640$ nm) |
|---|---|---|---|
| Second layer | N-type cladding layer | Si doped GaN | 2.50 |
| Intermediate layer | Intermediate layer | InGaN | 2.55 |
| Active layer | Active layer | Multiple quantum well structure Well layer: $In_{0.4}Ga_{0.6}N$ 2 nm Barrier layer: GaN 14 nm | Well layer: 2.75 Barrier layer: 2.50 Thickness-weighted-average: 2.53 |
| First layer | P-type cladding layer | Mg doped $Al_{0.4}Ga_{0.6}N$ | 2.40 |
| | P-type current diffused layer | Mg doped GaN | 2.50 |
| Substrate layer | Reflective layer | $SiO_2$ | 1.45 |
| | P-type Ohmic layer | Pt/Ag | — |
| | Bonding layer | AuSn | — |
| | Substrate | Si | — |

In the example shown in Table 5 above, the difference in the refractive index between the first layer and the second layer is 0.1 ($\Delta n=0.1$). x in $In_xGa_{1-x}N$ represents the proportion of In composition. The proportion in the active layer is in the range of 0 to 0.4 (average of the well layer and the barrier layer). The proportion in the second layer is in the range of 0 to 0.5. The proportion in the intermediate layer is in the range of 0 to 0.4 (the proportion in the active layer>the proportion in the intermediate layer).

A production process of the GaN-based LED is now described.

First, a GaN-based LED having an asymmetric refractive index distribution is formed on a sapphire growth substrate by MOCVD. Specifically, a GaN or AlN buffer layer having a thickness of about several to 10 nm is formed on a growth substrate. An n-type cladding layer made of Si-doped GaN having a thickness of about 1 to 6 um is then deposited (second layer). Subsequently, an active layer made of InGaN is deposited. In this example, the active layer has a multiple quantum well structure comprising a well layer of $In_xGa_{1-x}N$ (x=0.2, 2 nm) and a barrier layer of GaN (14 nm). The In composition (x) of the well layer may be adjusted depending on the emission wavelength and is not limited to the described composition.

Subsequently, an Mg-doped p-AlGaN layer and then a p-type cladding layer formed of p-GaN are grown to establish the asymmetric refractive index distribution (first layer).

ensure electrical connection and close contact with AuSn. The resulting stack formed by MOCVD is then bonded to a permanent substrate (e.g., Si) having AuSn formed thereon. Specifically, the stacks are heated and pressed so that the molten AuSn bonds them together.

When a sapphire substrate is used, the growth substrate can be removed by irradiating a pulse laser from behind the growth substrate.

Once the semiconductor crystals have been grown by MOCVD, a two-dimensional periodic structure is formed on the n-type cladding layer (GaN). The two-dimensional periodic structure is formed as described above.

In the example, a two-dimensional periodic structure arranged in an array of circular pores forming a triangular lattice is formed on the n-GaN serving as the second layer. The two-dimensional periodic structure has a period of 700 nm (a), a radius of the circular pore of 200 nm (r), a depth of 400 nm (d), and the distance from the active layer of 120 nm (h).

When the permanent substrate is conductive, an electrode for supplying current to the LED is formed on the bottom side of the permanent substrate and on the top side of the n-type cladding GaN layer.

When the p-side region of a GaN-based LED is processed, the crystals may be damaged by, for example, dry etching, resulting in an increased resistance of the p-type layer. The process used in this example allows the processing on the n-side layer, so that the increase in the resistance of the p-type layer can be avoided. In some cases, a GaN-based LED having an asymmetric refractive index distribution, a characteristic feature of the present invention, is difficult to produce by direct deposition of a semiconductor layer on the growth substrate serving as a permanent substrate since an n-type cladding layer formed of AlGaN with high Al content must be formed to serve as the first low refractive index layer and the AlGaN layer formed on the n-type side functions as a barrier to electrons, resulting in a decreased electron injection ability. However, such an LED can be produced by bonding the separately prepared structure and substrate together, as in the example.

A light wave optics simulation was conducted on the GaInN-based LED. The results are described in the following. Parameters of the two-dimensional periodic structure used in the light wave optics simulation of the GaN-based LED are shown in Table 6 below. The parameters of the simulation are shown in FIG. 14 as in the simulation of the AlGaInP-based LED. In the light wave optics simulation, the emission wavelength $\lambda_0$ (in vacuum) is 455 nm, the excitation method is incoherent, the time step is 0.03 fs, and the cell size is 20 nm×20 nm×20 nm.

TABLE 6

Parameters of two-dimensional periodic structure

| Parameters | Assigned letters | Value | Unit |
|---|---|---|---|
| Arrangement | — | Triangular lattice | — |
| Geometry | — | Circular pores | — |
| Pitch | a | 700 | nm |
| Radius | r | 200 | nm |
| Depth | d | 400 | nm |
| Distance from the active layer | h | 120, 400, 600 | nm |

Figure 18:
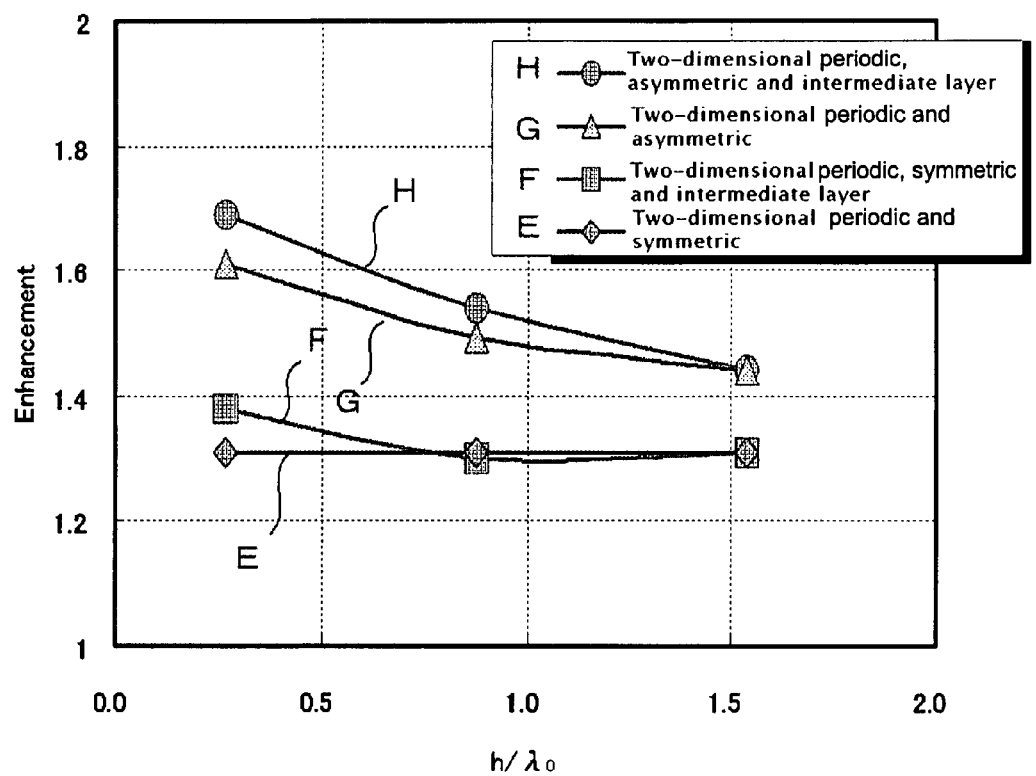
FIG. 18 is a graph showing the light extraction effect of different GaN-based LEDs of the present invention.

FIGS. 17 and 18 show the light extraction efficiencies of different GaN-based LEDs as the results of the simulation.

FIG. 17 shows light extraction efficiencies of different constructions of the GaN-based LED. The constructions are as follows: A construction with no two-dimensional periodic structure having a symmetric refractive index distribution with respect to the active layer (referred to as "basic structure" or "planar symmetric" hereinafter); a construction with no two-dimensional periodic structure having an asymmetric refractive index distribution with respect to the active layer (referred to as "planar asymmetric" hereinafter); a construction with a two-dimensional periodic structure having a symmetric refractive index distribution with respect to the active layer (referred to as "two-dimensional periodic and symmetric" hereinafter); a construction with a two-dimensional periodic structure that has a symmetric refractive index distribution with respect to the active layer and an intermediate layer (referred to as "two-dimensional periodic, symmetric and intermediate layer" hereinafter); a construction with a two-dimensional periodic structure having an asymmetric refractive index distribution with respect to the active layer (referred to as "two-dimensional periodic and asymmetric" hereinafter); and a construction with a two-dimensional periodic structure that has an asymmetric refractive index distribution with respect to the active layer and an intermediate layer (referred to as "two-dimensional periodic, asymmetric and intermediate layer" hereinafter).

FIG. 18 shows the relationship between the ratio of the light intensity of each construction to the light intensity of the basic structure and the ratio $h/\lambda_0$ where h is the distance between the bottom of the two-dimensional periodic structure and the active layer and $\lambda_0$ is the emission wavelength (in vacuum) (455 nm in FIGS. 17 and 18).

The signs E, F, G and H in FIG. 17 represent the "two-dimensional periodic and symmetric," "two-dimensional periodic, symmetric and intermediate layer," "two-dimensional periodic and asymmetric," and "two-dimensional periodic, asymmetric and intermediate layer," respectively.

As can be seen from the results, the light extraction efficiency is markedly high in "two-dimensional periodic and asymmetric" (G) and "two-dimensional periodic, asymmetric and intermediate layer" (H), each being a construction with an asymmetric refractive index distribution. Of these, the light extraction is higher in "two-dimensional periodic, asymmetric and intermediate layer" (H), the construction having the intermediate layer. It is observed that the light extraction efficiency increases as the ratio of the distance h to the wavelength ($h/\lambda_0$) decreases in each of "two-dimensional periodic, symmetric and intermediate layer" (F), "two-dimensional periodic and asymmetric" (G) and "two-dimensional periodic, asymmetric and intermediate layer" (H). In the constructions having an asymmetric refractive distribution, the increase in the light extraction efficiency caused by the intermediate layer is significant when the distance h between the active layer and the bottom of the two-dimensional periodic structure is less than or equal to 1.5 n$\lambda$ ($h/n\lambda_0$=1.5). In the constructions having symmetric refractive distribution, the increase in the light extraction efficiency caused by the intermediate layer is significant when the distance h is less than or equal to 0.7 n$\lambda$ ($h/n\lambda_0$=0.7).

The results of the simulation of GaN-based LEDs shown in FIGS. 17 and 18 indicate a tendency in the light extraction efficiency of GaN-based LEDs that is similar, though less significant, to what is observed in the simulation of AlGaInP-based LEDs. This suggests that the LEDs using the different materials show a similar tendency.

The construction, the production process and the light extraction efficiency of the light emitting device of the present invention as determined by a simulation will now be described for other exemplary light emitting devices using two different materials: AlGaInP and GaN.

The construction of light emitting device 1 shown in FIG. 1 includes a two-dimensional periodic structure 10 on the light emitting surface. Specifically, it includes a first layer 2, an active layer 3 overlaying the first layer 2, and a second layer 4 overlaying the active layer 3. The two dimensional periodic structure 10 is formed either in the surface of the second layer 4 or in the surface of a layer overlaying the second layer 4. In this embodiment, an intermediate layer is further disposed within the second layer. The intermediate layer has a refractive index lower than or equal to that of the active layer, but higher than that of any of the other constituent layers of the second layer.

The first layer 2 and the second layer 4 may have the same refractive index so that a symmetrical refractive index distribution is formed with respect to the active layer 3 in between. Alternatively, the first layer 2 and the second layer 4 may have different refractive indices so that an asymmetrical refractive index distribution is formed with respect to the active layer 3 in between. In this structure, the refractive index of the second layer 4 is higher than that of the first layer 2.

Although the first layer, the second layer and the active layer in the above-described structure each consist of a single layer, each layer may consist of multiple layers. Actual light emitting devices generally consist of multiple layers with different functions. Thus, the first layer and the second layer may each consist of a buffer layer, a contact layer or a current-diffusion layer and the active layer may have a multiple quantum well structure. The intermediate layer may be disposed either within any constituent layer of the second layer or between any two layers as long as it is not arranged adjacent to the active layer.

When the second layer consists of multiple layers, the intermediate layer is not arranged adjacent to the active layer. When the active layer has a multiple quantum well structure, the intermediate layer is preferably designed to have a refractive index lower than or equal to that of the well layer of the active layer. The intermediate layer preferably has a refractive index close to that of the active layer (above all, that of the well layer for the multiple quantum well structure). The reason for this is that while the intermediate layer having a greater refractive index is considered more effective in terms of the coupling with the two-dimensional periodic structure, it preferably is made of a material having a smaller band gap than the active layer, and thus having a refractive index lower than or equal to that of the active layer (above all, that of the well layer for the multiple quantum well structure).

When the first and the second layers form an asymmetric refractive index distribution, the first layer is designed to have a lower refractive index than the layer of the second layer adjacent to the active layer. When the active layer consists of multiple layers, the thickness-weighted-average of the refractive indices of the constituent layers of the active layer is assumed to be the refractive index of the active layer, and the first layer and the second layer are each formed of a layer having a lower refractive index than the refractive index of the active layer. The reason for this is that when the active layer has a multiple quantum well structure, the light emission is affected by the average refractive index of the constituent layers, rather than by the individual refractive indices, because the thickness of the well layer or the barrier layer of the multiple quantum well structure (several nm) is less than one-tenth of the wavelength of the emission.

The light emitting device of the present embodiment is now described with reference to FIG. 19.

Figure 19:
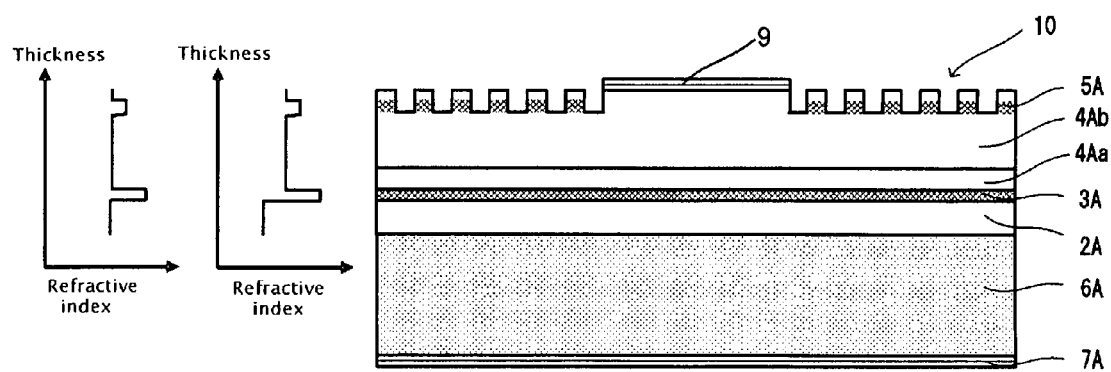
FIG. 19 is an illustrative diagram showing an AlGaInP-based LED of the present invention having a two-dimensional periodic structure, asymmetric refractive index feature and an intermediate layer.

Referring to FIG. 19, one construction of the light emitting device is shown in which the intermediate layer is arranged at the bottom of the recesses of the two-dimensional periodic structure. The refractive index distribution of the device is also shown. This construction is fabricated by stacking the following layers on a substrate layer 6A: a semiconductor cladding layer 2A of a first conductivity type (a first layer), an active layer 3A and a second layer 4A (i.e., a semiconductor cladding layer 4Aa of a second conductivity type, a current-diffusion layer 4Ab, an intermediate layer 5A and a current-diffusion layer 4Ab). A two-dimensional periodic structure 10 is formed in the surface of the current-diffusion layer 4Ab within the second layer 4A. An electrode 7A is disposed below the substrate layer 6A, and an electrode 9 is disposed above the second layer 4A.

Figure 20:
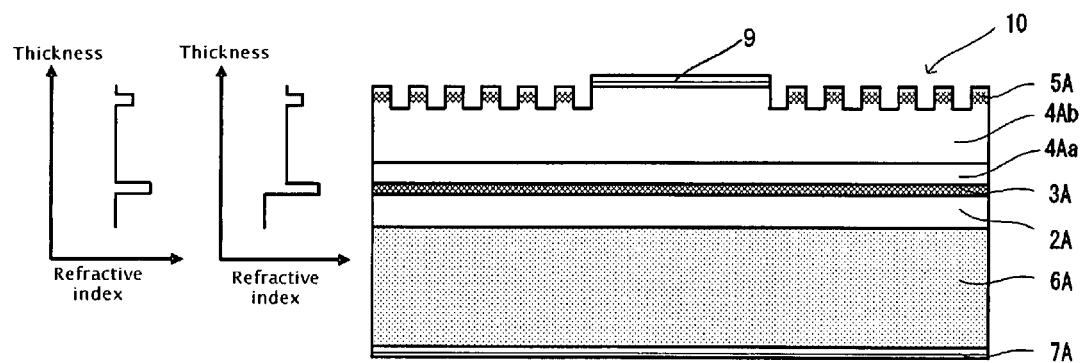
FIG. 20 is an illustrative diagram showing another AlGaInP-based LED of the present invention having a two-dimensional periodic structure, asymmetric refractive index feature and an intermediate layer.

Referring to FIG. 20, another construction of the light emitting device is shown in which the intermediate layer is arranged in the mid-portion of the recesses of the two-dimensional periodic structure. The refractive index distribution of the device is also shown. This construction is identical to the construction of FIG. 19 except for the position of the intermediate layer 5A.

Figure 21:
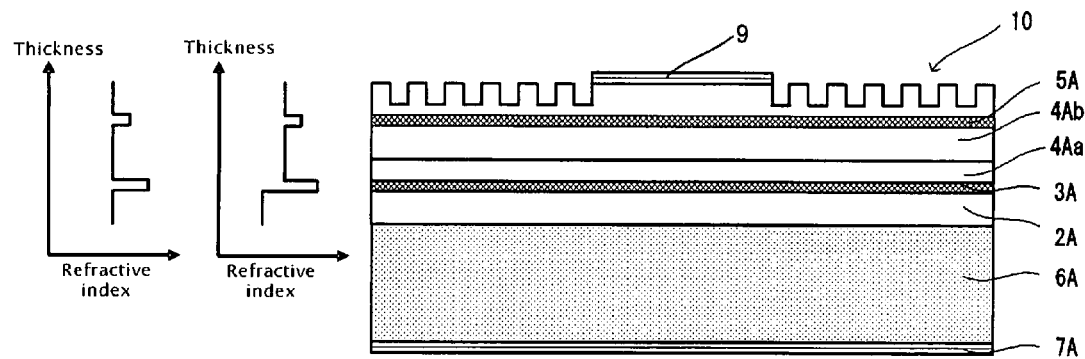
FIG. 21 is an illustrative diagram showing another AlGaInP-based LED of the present invention having a two-dimensional periodic structure and asymmetric refractive index feature.

Referring to FIG. 21, another construction of the light emitting device is shown in which the intermediate layer is arranged below the recesses of the two-dimensional periodic structure. The refractive index distribution of the device is also shown. This construction is identical to the construction of FIG. 19 or 20 except for the position of the intermediate layer 5A.

Figure 22:
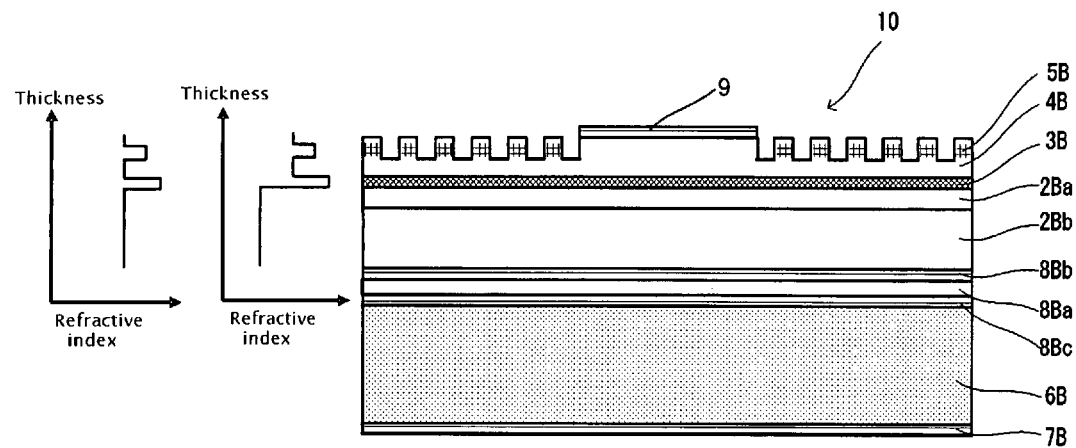
FIG. 22 is an illustrative diagram showing another AlGaInP-based LED of the present invention having a two-dimensional periodic structure, asymmetric refractive index feature and an intermediate layer.

Referring to FIG. 22, another construction of the light emitting device is shown in which the intermediate layer is arranged at the bottom the recesses of the two-dimensional periodic structure, as in the construction of FIG. 19. The refractive index distribution of the device is also shown. This construction differs from the construction of FIG. 19 in that electrodes 8Bb, 8Bc and a bonding layer 8Ba are disposed between the substrate and the semiconductor layer. This difference (i.e., the structure lying between the substrate and the semiconductor layer) comes from the difference in the production process: This construction is made by forming a semiconductor layer on a temporary growth substrate (which is removed later) and laminating the semiconductor layer on a separate permanent substrate, rather than by directly growing the semiconductor layer on the substrate.

The second layer (the semiconductor cladding layer 4B of the second conductivity type, the intermediate layer 5B and the semiconductor cladding layer 4B of the second conductivity type), the active layer 3B and the first layer 2B (the current-diffusion layer 2Bb and the semiconductor cladding layer 2Ba of the first conductivity type) are grown on the temporary growth substrate (not shown). Subsequently, the Ohmic electrode 8Bb and part of the bonding layer 8Ba are formed. Meanwhile, the electrode 8Bc and part of the bonding layer 8Ba are formed on the substrate 6B. The resulting two stacks are heat-bonded together with the bonding layers 8Ba facing each other. The temporary growth substrate is removed. The two-dimensional periodic structure 10 is then formed on the exposed surface of the semiconductor cladding layer 4B of the second conductivity type. The electrode 8Bb serves to form an Ohmic junction with the semiconductor layer and to reflect the light propagating from the active layer to the substrate before it reaches the substrate.

Figure 23:
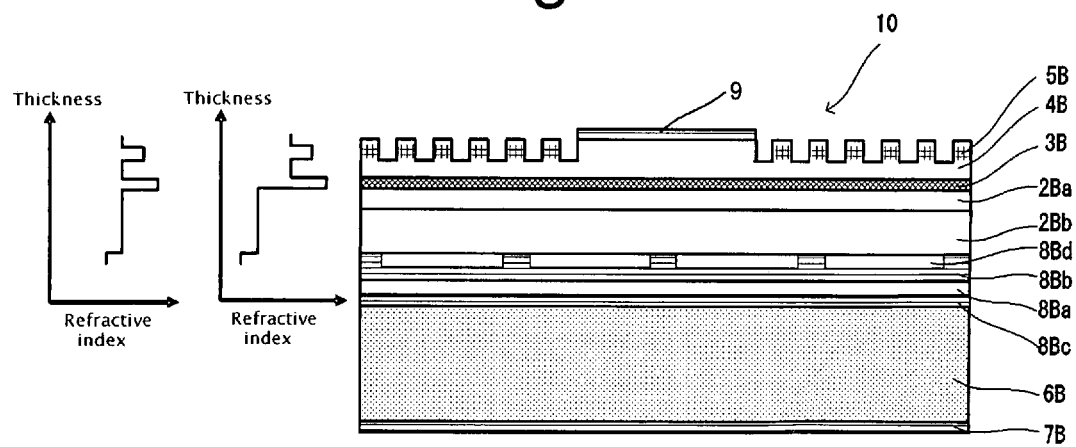
FIG. 23 is an illustrative diagram showing another AlGaInP-based LED of the present invention having a two-dimensional periodic structure, asymmetric refractive index feature and an intermediate layer.

Referring to FIG. 23, another construction of the light emitting device is shown in which the intermediate layer is arranged at the bottom the recesses of the two-dimensional periodic structure, as in the constructions of FIGS. 19 and 22. The refractive index distribution of the device is also shown. This construction differs from the construction of FIG. 19 or 22 in that a reflective layer 8Bd having a high reflectance (or a low refractive index) is disposed between the substrate and the semiconductor layer. The layer 8Bd having a higher reflectance than the electrode 8Bb in FIG. 22 serves to further increase the light extraction efficiency.

In FIGS. 19 through 23, the intermediate layer 5A or 5B has a refractive index lower than or equal to that of the active layer 3A and higher than that of any of the other constitutive layers of the second layer 4A. The intermediate layer 5A or 5B may be disposed within (FIGS. 19 and 20), outside (FIG. 21), or across from the inside to the outside of (not shown), the two-dimensional periodic structure. The refractive indices of the first and the second layers may be the same, or the refractive index of the second layer may be higher than that of the first layer. The latter is preferred.

Examples of AlGaInP-based materials for the constituent layers of the constructions of FIGS. 19, 20 and 21 are shown in Table 7 below, along with their refractive indices. Likewise, examples of materials for the constituent layers of the constructions of FIGS. 22 and 23 are shown in Table 8 below, along with their refractive indices.

In each case, the second layer has a higher refractive index than the first layer.

The refractive index of the active layer, which comprises the multiple quantum well structure, is the thickness-weightaverage (3.41) of the refractive indices of the well layer (AlGaInP, z=0.15, thickness=20 nm, n=3.46) and the barrier layer (AlGaInP, z=0.56, thickness=10 nm, n=3.30).

TABLE 7

| Constituent layers of LED | | Materials (examples) | Refractive index ($\lambda_0$ = 640 nm) |
|---|---|---|---|
| Second layer | P-type current diffused layer | Zn doped GaP | 3.30 |
| | P-type cladding layer | Zn doped $(Al_{0.7}Ga_{0.3})_{0.5}In_{0.5}P$ | 3.26 |
| Intermediate layer | Intermediate layer | $(Al_{0.3}Ga_{0.7})_{0.5}In_{0.5}P$ Z = 0.3 | 3.39 |
| Active layer | Active layer | $(Al_zGa_{1-z})_{0.5}In_{0.5}P$ Well layer: z = 0.15, 20 nm Barrier layer: z = 0.56, 10 nm | Well layer: 3.46 Barrier layer: 3.30 Thickness-weighted-average: 3.41 |
| First layer | N-type cladding layer | Si doped AlInP z = 1.0 | 3.17 |
| | N-type buffer layer | Si doped GaAs | — |
| Substrate layer | Substrate | Si doped GaAs | — |

TABLE 8

| Constituent layers of LED | | Materials (examples) | Refractive index ($\lambda_0$ = 640 nm) |
|---|---|---|---|
| Second layer | N-type contact layer | Si doped $(Al_zGa_{1-z})_{0.5}In_{0.5}P$ | 3.26 |
| | N-type cladding layer | Si doped $(Al_zGa_{1-z})_{0.5}In_{0.5}P$ | 3.26 |
| Intermediate layer | Intermediate layer | Si doped $(Al_{0.3}Ga_{0.7})_{0.5}In_{0.5}P$ | 3.39 |
| Active layer | Active layer | Multiple quantum well structure $(Al_zGa_{1-z})_{0.5}In_{0.5}P$ Well layer: z = 0.15, 20 nm Barrier layer: z = 0.56, 10 nm | Well layer: 3.46 Barrier layer: 3.30 Thickness-weighted-average: 3.41 |
| First layer | P-type cladding layer | Zn doped $Al_{0.5}In_{0.5}P$ | 3.17 |
| | P-type current diffused layer | Zn doped GaP | 3.30 |
| Substrate layer | Reflective layer | $SiO_2$ | 1.45 |
| | P-type Ohmic layer | AuZn | — |
| | Bonding layer | AuSn | — |
| | Substrate | Si | — |

In Table 7, z in the general formula $(Al_zGa_{1-z})_{0.5}In_{0.5}P$ represents the proportion of Al composition. The proportion in the active layer is in the range of 0 to 0.6. The proportion in the first and the second layers is in the range of 0.5 to 1.0. The proportion in the intermediate layer is in the range of 0 to 0.6. The refractive index of the active layer is higher than that of the intermediate layer while z of the active layer is lower than that of the intermediate layer.

In fabricating the light emitting device of the present invention, two different techniques can be employed as described above. In one technique, a semiconductor layer is directly grown on the substrate to make the constructions shown in FIGS. 19, 20 and 21. In the other technique, a permanent substrate and a semiconductor layer are bonded together by using, for example, metal bonding to make the constructions shown in FIGS. 22 and 23.

Using the metal organic chemical vapor deposition (MOCVD) technique, an n-type cladding layer, an active layer, a p-type cladding layer, and a current-diffusion layer (CSL) for ensuring Ohmic contact with the electrode are sequentially grown on an n-type GaAs growth substrate. The n-type cladding layer is made of AlGaInP and the current-diffusion layer is made of GaP. In this example, the active layer having a composition of $(Al_zGa_{1-z})_{0.5}In_{0.5}P$ has a multiple quantum well structure comprising a well layer (z=0.15, 20 nm) and a barrier layer (z=0.56, 10 nm). However, the Al composition (z) of the well layer and the barrier layer may be adjusted depending on the emission wavelength and may have any value within the range of 0<z<0.7.

The refractive index of the AlGaInP-based material having a composition of $(Al_zGa_{1-z})_{1-x}In_xP$ can be changed by adjusting x to 0.5 (x=0.5) and changing the Al composition (z) so as to ensure lattice alignment with the GaAs substrate. Thus, the n-type cladding layer and the p-type cladding layer are selected by adjusting the Al composition of AlGaInP.

In this example, the n-type cladding layer (z=1.0), the p-type cladding layer (z=0.7) and the CSL are each made of GaP in consideration of containment of electrons/holes by band offset and refractive index. As the intermediate layer, an AlGaInP layer with its Al composition z adjusted to 0.3 (z=0.3) is inserted between the p-type cladding layer and the CSL. The Al composition is adjusted such that the intermediate layer has a higher refractive index than the CSL and does not absorb the light emitted from the active layer (has a lower refractive index than the active layer). In the example, the intermediate layer has a refractive index of 3.39.

Since the current-diffusion layer is grown after the active layer, it is acceptable as long as it is transparent to the light, has electrical conductivity, and can form an Ohmic contact with a gold alloy. Even when GaP that has a lattice constant differing from the lattice constant of GaSa by about 3% is used, the current-diffusion layer of sufficient performance can be produced by growing the crystals at temperatures 50 to 100° C. higher than the growth temperature of AlGaInP. AlGaAs and GaInP may also be used. The In composition of GaInP may be adjusted to achieve the desired refractive index.

Following the growth by MOCVD, a two-dimensional periodic structure is formed on the CSL. As used herein, the term "two-dimensional periodic structure" refers to any of the following periodic structures: triangular lattice, square lattice and hexagonal lattice, and quasicrystals that do not have translational symmetry, such as Penrose tiling and square-triangle tiling having a 12-fold symmetry.

In the example, a two-dimensional periodic structure arranged in an array of circular pores forming a triangular lattice is formed on the CSL serving as the second layer. The two-dimensional periodic structure has a period of 1000 nm (a), a radius of the circular pore of 300 nm (r), a depth of 600 nm (d), and the distance from the active layer of 600 nm (h).

The electrode for supplying current is formed by the technique described above, and a description therefor will be omitted.

The technique by which an AlGaInP-based LED formed on a permanent substrate (Si) layer is metal-bonded to make the light emitting device can be performed as described above (See, FIG. 13). The description of the technique is not repeated here.

A light wave optics simulation was conducted on the above-described AlGaInP-based LED. The results are described in the following. Parameters of the two-dimensional periodic structure used in the light wave optics simulation of the AlGaInP-based LED are shown in Table 9 below. The parameters of the simulation are also shown in FIG. 14. In the light wave optics simulation, the emission wavelength $\lambda_0$ (in vacuum) is 640 nm, the excitation method is incoherent, the time step is 0.03 fs, and the cell size is 20 nm×20 nm×20 nm.

TABLE 9

Parameters of two-dimensional periodic structure

| Parameters | Assigned letters | Value | Unit |
| --- | --- | --- | --- |
| Arrangement | — | Triangular lattice | — |
| Geometry | — | Circular pores | — |
| Pitch | a | 1000 | nm |
| Radius | r | 300 | nm |
| Depth | d | 600 | nm |
| Distance from the active layer | h | 100, 200, 600, 1000 | nm |

The light extraction efficiencies of different constructions shown in FIG. 15 are compared.

The results of the simulation shown in FIGS. 15 and 16, in particular the comparison of A and B and the comparison of C and D, indicate that the construction having the intermediate layer has an increased light extraction efficiency when the ratio of the distance h to the wavelength ($h/\lambda_0$) is relatively small. The results also indicate that the light extraction efficiency of this construction increases as the value of $h/\lambda_0$ decreases.

When the distance h between the active layer and the two-dimensional periodic structure is smaller than $\lambda_0$, the light extraction efficiency is higher than the "planar symmetric" in each of "two-dimensional periodic and symmetric," "two-dimensional periodic, symmetric and intermediate layer," "two-dimensional periodic and asymmetric," and "two-dimensional periodic, asymmetric and intermediate layer." When the value of $h/\lambda_0$ is 1, h equals nλ. Thus, the light extraction efficiency increases when the distance between the active layer and the two-dimensional periodic structure is smaller than or equal to nλ. Particularly high light extraction efficiency is observed in "two-dimensional periodic, symmetric and intermediate layer" and "two-dimensional periodic, asymmetric and intermediate layer." These observations indicate that the intermediate layer serves as a directional coupler that facilitates the coupling between the active layer and the two-dimensional periodic structure. Particularly high light extraction efficiency is observed in "two-dimensional periodic, asymmetric and intermediate layer."

The reason that the light extraction efficiency for "two-dimensional periodic, asymmetric and intermediate layer" is higher than anticipated from the results obtained for "two-dimensional periodic, symmetric and intermediate layer" and "two-dimensional periodic and asymmetric" is considered to be as follows: Of all of the light that is guided through the light extraction surface and the active layer, the light guided to the light extraction surface is coupled to the two-dimensional periodic structure and is extracted due to the formation of the asymmetric refractive index distribution whereas the light guided through the active layer is coupled to the two-dimensional periodic structure via the intermediate layer and is then extracted.

While the intermediate layer has a refractive index lower than or equal to that of the active layer and higher than that of any of the constitutive layers of the second layer, it may have a refractive index substantially the same as that of the active layer.

When a two-dimensional periodic structure is formed on the active layer, the efficiency of the light emitting device significantly decreases due to the surface recombination. However, by disposing an intermediate layer having a refractive index substantially the same as that of the active layer either within or adjacent to the two-dimensional periodic structure, the intermediate layer serves as a directional coupler that facilitates the coupling between the active layer and the two-dimensional periodic structure and thus increases the light extraction efficiency. The intermediate layer prevents the decrease in the efficiency caused by the surface recombination. It also eliminates the need to form a deep two-dimensional periodic structure reaching the active layer and therefore facilitates the production process.

Examples of materials for the constituent layers of different constructions of the GaN-based LED are shown in Tables 10 and 11, along with their refractive indices. Table 10 is of a construction including a two-dimensional periodic structure and an intermediate layer as shown in FIGS. 19 through 21. The two layers on the sides of the active layer form a symmetric refractive index distribution. Table 11 is of a construction including a two-dimensional periodic structure and an intermediate layer as shown in FIGS. 22 and 23. The two layers on the sides of the active layer form an asymmetric refractive index distribution.

The refractive index of the active layer, which comprises the multiple quantum well structure, is the thickness-weightaverage (n=2.53) of the refractive indices of the well layer ($In_xGa_{1-x}N$, x=0.4, thickness=2 nm, n=2.75) and the barrier layer (GaN, thickness=14 nm, n=2.50).

TABLE 10

| Constituent layers of LED | | Materials (examples) | Refractive index ($\lambda_0$ = 640 nm) |
|---|---|---|---|
| Second layer | P-type cladding layer | Mg doped GaN | 2.50 |
| Intermediate layer | Intermediate layer | InGaN | 2.55 |
| Active layer | Active layer | Multiple quantum well structure Well layer: $In_{0.4}Ga_{0.6}N$ 2 nm Barrier layer: GaN 14 nm | Well layer: 2.75 Barrier layer: 2.50 Thickness-weighted-average: 2.53 |
| First layer | N-type cladding layer | Si doped GaN | 2.50 |
|  | N-type buffer layer | Si doped GaN | 2.50 |
| Substrate layer | Substrate | Si | — |

TABLE 11

| Constituent layers of LED | | Materials (examples) | Refractive index ($\lambda_0$ = 455 nm) |
|---|---|---|---|
| Second layer | N-type cladding layer | Si doped GaN | 2.50 |
| Intermediate layer | Intermediate layer | InGaN | 2.55 |
| Active layer | Active layer | Multiple quantum well structure Well layer: $In_{0.4}Ga_{0.6}N$ 2 nm Barrier layer: GaN 14 nm | Well layer: 2.75 Barrier layer: 2.50 Thickness-weighted-average: 2.53 |
| First layer | P-type cladding layer | Mg doped $Al_{0.4}Ga_{0.6}N$ | 2.40 |
|  | P-type current diffused layer | Mg doped GaN | 2.50 |
| Low reflective layer | Reflective layer | $SiO_2$ | 1.45 |
| Substrate layer | P-type Ohmic layer | Pt/Ag | — |
|  | Bonding layer | AuSn | — |
|  | Substrate | Si | — |

The proportion x of the In composition in $In_xGa_{1-x}N$ is not limited to those shown in the tables above: The proportion x of the In composition in the active layer is preferably in the range of 0 to 0.4 (average of the well layer and the barrier layer). The proportion in the second layer is preferably in the range of 0 to 0.5. The proportion in the intermediate layer is preferably in the range of 0 to 0.4 (the proportion in the active layer>the proportion in the intermediate layer). The desired refractive index can be achieved by adjusting the In composition.

A production process of an exemplary construction of the GaN-based LED shown in FIG. 22 is now described.

First, a GaN or AlN buffer layer having a thickness of about several to 10 nm is formed on a growth substrate by MOCVD. The following layers are then sequentially formed: an n-type cladding layer made of Si-doped GaN having a thickness of about 1 to 6 um; an intermediate layer made of InGaN having its In composition adjusted to achieve a higher refractive index than the n-type cladding layer (intermediate layer is introduced within the n-type cladding layer); an active layer made of InGaN; an Mg-doped p-AlGaN layer for establishing the asymmetric refractive index distribution; and a p-type cladding layer formed of p-GaN.

Subsequently, an electrode layer of a Pt/Ag alloy is deposited (to a thickness of 3000 angstrom) on the surface of the p-type cladding layer by, for example, sputtering to ensure electrical connection to the semiconductor crystals. A metal layer of Ta, Au is then deposited (to a thickness of 3000 angstrom) to ensure electrical connection and close contact with AuSn. The resulting stack is then bonded to a permanent substrate (e.g., Si) having AuSn formed thereon. Specifically, the stacks are heated and pressed so that the molten AuSn bonds them together.

When a sapphire substrate is used, the growth substrate can be removed by irradiating a pulse laser from behind the growth substrate. A two-dimensional periodic structure is then formed on the n-type cladding layer (GaN). The two-dimensional periodic structure is formed as described above.

In the example, a two-dimensional periodic structure arranged in an array of circular pores forming a triangular lattice is formed on the n-GaN serving as the second layer. The two-dimensional periodic structure has a period of 700 nm (a), a radius of the circular pore of 200 nm (r), a depth of 400 nm (d), and the distance from the active layer of 120 nm (h).

When the permanent substrate is conductive, an electrode for supplying current to the LED is formed on the bottom side of the permanent substrate and on the top side of the n-type cladding GaN layer.

When the p-side region of a GaN-based LED is processed, the crystals may be damaged by, for example, dry etching, resulting in an increased resistance of the p-type layer. The process used in this example allows the processing on the n-side layer, so that the increase in the resistance of the p-type layer can be avoided. In some cases, a GaN-based LED having an asymmetric refractive index distribution, a characteristic feature of the present invention, is difficult to produce by direct deposition of a semiconductor layer on the growth substrate serving as a permanent substrate since an n-type cladding layer formed of AlGaN with high Al content must be formed to serve as the first low refractive index layer and the AlGaN layer formed on the n-type side functions as a barrier to electrons, resulting in a decreased electron injection ability. However, such an LED can be produced by the separately prepared structure and substrate together, as in the example.

A light wave optics simulation was conducted on the GaInN-based LED. The results are described in the following. Parameters of the two-dimensional periodic structure used in the light wave optics simulation of the GaN-based LED are shown in Table 12 below. The parameters of the simulation are shown in FIG. 14 as in the simulation of the AlGaInP-based LED. In the light wave optics simulation, the emission wavelength $\lambda_0$ (in vacuum) is 455 nm, the excitation method is incoherent, the time step is 0.03 fs, and the cell size is 20 nm×20 nm×20 nm.

TABLE 12

| Parameters of two-dimensional periodic structure | | | |
|---|---|---|---|
| Parameters | Assigned letters | Value | Unit |
| Arrangement | — | Triangular lattice | — |
| Geometry | — | Circular pores | — |
| Pitch | a | 700 | nm |
| Radius | r | 200 | nm |
| Depth | d | 400 | nm |
| Distance from the active layer | h | 120, 400, 600 | nm |

Referring back to FIGS. 17 and 18, the light extraction efficiency of different GaN-based LEDs as the results of the simulation is shown.

The comparison between "two-dimensional periodic and symmetric" (E) and "two-dimensional periodic, symmetric and intermediate layer" (F) and the comparison between "two-dimensional periodic and asymmetric" (G) and "two-dimensional periodic, asymmetric and intermediate layer" (H) indicate that the intermediate layer serves to increase the light extraction efficiency. The results also indicate that the light extraction efficiency is markedly high in "two-dimensional periodic and asymmetric" (G) and "two-dimensional periodic, asymmetric and intermediate layer" (H), each being a construction with asymmetric refractive index distribution. Of these, the light extraction is higher in "two-dimensional periodic, asymmetric and intermediate layer" (H), the construction having the intermediate layer. The improvement in the light extraction efficiency caused by the intermediate layer and the asymmetric refractive index distribution becomes more significant as the ratio of the distance h to the wavelength ($h/\lambda_0$) decreases. In the constructions having asymmetric refractive distribution, the increase in the light extraction efficiency caused by the intermediate layer is significant when the distance h between the active layer and the bottom of the two-dimensional periodic structure is less than or equal to 1.5 n$\lambda$ ($h/n\lambda_0$=1.5). In the constructions having symmetric refractive distribution, the increase in the light extraction efficiency by the intermediate layer is significant when the distance h is less than or equal to 0.7 n$\lambda$ ($h/n\lambda_0$=0.7).

The results of the simulation of GaN-based LEDs shown in FIGS. 17 and 18 indicate a tendency in the light extraction efficiency of GaN-based LEDs that is similar, though less significant, to what is observed in the simulation of AlGaInP-based LEDs. This suggests that the LEDs using the different materials show a similar tendency.

The present invention is applicable to semiconductor LEDs, as well as to white lighting, illuminations, indicators, LED communications and other fields that use the semiconductor LEDs.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting device comprising:
a substrate layer;
a first layer which is disposed above the substrate layer, and which comprises at least one layer including a semiconductor cladding layer of a first conductivity type;
an active layer disposed above the first layer; and
a second layer which is disposed above the active layer, and which comprises a semiconductor cladding layer of a second conductivity type, a current-diffusion layer, and an intermediate layer located above the current-diffusion layer, the second layer having a two-dimensional periodic structure in a surface thereof, wherein the two-dimensional periodic structure is formed above the current diffusion layer,
wherein the first layer includes at least one layer having a refractive index that is lower than a refractive index of the active layer and lower than a refractive index of a layer of the second layer that is adjacent to the active layer,
wherein each constituent layer of the second layer other than the intermediate layer has a lower refractive index than the active layer, and
wherein the intermediate layer has a refractive index that is less than or equal to the refractive index of the active layer and that is higher than a refractive index of the semiconductor cladding layer of the second conductivity type.

2. A light emitting device comprising:
a substrate layer;
a first layer which comprises at least one layer and which is disposed above the substrate layer;
an active layer which has a multiple quantum well structure and which is disposed above the first layer; and
a second layer which is disposed above the active layer, and which comprises a semiconductor cladding layer, a current-diffusion layer, and an intermediate layer located above the current-diffusion layer, the second layer having a two-dimensional periodic structure in a surface thereof, wherein the two-dimensional periodic structure is formed above the current-diffusion layer,
wherein the first layer includes at least one layer having a refractive index that is lower than a thickness-weighted-average of refractive indices of the active layer and lower than a refractive index of a layer of the second layer that is adjacent to the active layer, wherein each constituent layer of the second layer other than the intermediate layer has a lower refractive index than the thickness-weighted-average of the refractive indices of the active layer, and wherein the intermediate layer has a refractive index that is less than or equal to the thickness-weighted-average of refractive indices of the active layer and that is higher than a refractive index of the semiconductor cladding layer.

3. A light emitting device comprising:
a substrate layer;
a first layer which comprises at least one layer and which is disposed above the substrate layer;
an active layer which has a multiple quantum well structure and which is disposed above the first layer; and
a second layer which is disposed above the active layer, and which comprises a semiconductor cladding layer, a current-diffusion layer, and an intermediate layer located above the current-diffusion layer, the second layer having a two dimensional periodic structure in a surface thereof, wherein the two-dimensional periodic structure is formed above the current diffusion layer, wherein the first layer includes at least one layer having a refractive index that is lower than a thickness-weighted-average of refractive indices of the active layer and lower than a refractive index of a layer of the second layer that is adjacent to the active layer, wherein each constituent layer of the second layer other than the intermediate layer has a lower refractive index than the thickness-weighted-average of the refractive indices of the active layer, and wherein the intermediate layer has a refractive index that is less than or equal to a refractive index of a well layer of the multiple quantum well structure and that is higher than a refractive index of the semiconductor cladding layer.

4. The light emitting device according to claim 1, wherein a distance between a bottom of the two-dimensional periodic structure and a top of the active layer is in a range of 0.1nλ to nλ, where n is a refractive index of a layer between the bottom of the two-dimensional periodic structure and the top of the active layer, and λ is an optical wavelength of light emitted from the active layer.

5. The light emitting device according to claim 2, wherein a distance between a bottom of the two-dimensional periodic structure and a top of the active layer is in a range of 0.1nλ to nλ, where n is a refractive index of a layer between the bottom of the two-dimensional periodic structure and the top of the active layer, and λ is an optical wavelength of light emitted from the active layer.

6. The light emitting device according to claim 1, further comprising a high reflectance layer disposed between the substrate layer and the first layer.

7. The light emitting device according to claim 2, further comprising a high reflectance layer disposed between the substrate layer and the first layer.

8. The light emitting device according to claim 3, further comprising a high reflectance layer disposed between the substrate layer and the first layer.

9. The light emitting device according to claim 1, wherein the refractive index of the intermediate layer is higher than a refractive index of any other constituent layer of the second layer.

10. The light emitting device according to claim 2, wherein the refractive index of the intermediate layer is higher than a refractive index of any other constituent layer of the second layer.

11. The light emitting device according to claim 3, wherein the refractive index of the intermediate layer is higher than a refractive index of any other constituent layer of the second layer.

12. The light emitting device according to claim 1, wherein the intermediate layer is provided outside the two dimensional periodic structure.

13. The light emitting device according to claim 2, wherein the intermediate layer is provided outside the two dimensional periodic structure.

14. The light emitting device according to claim 3, wherein the intermediate layer is provided outside the two dimensional periodic structure.

15. A light emitting device comprising:
a substrate layer;
a first layer which is disposed above the substrate layer, and which comprises at least one layer including a semiconductor cladding layer of a first conductivity type;
an active layer disposed above the first layer; and
a second layer which is disposed above the active layer, and which has a two-dimensional periodic structure in a surface thereof, the second layer comprising multiple layers including a semiconductor cladding layer of a second conductivity type and an intermediate layer having a refractive index that is less than or equal to a refractive index of the active layer and that is higher than a refractive index of any other constituent layer of the second layer, wherein the intermediate layer is provided outside the two-dimensional periodic structure.

16. A light emitting device comprising:
a substrate layer;
a first layer which comprises at least one layer and which is disposed above the substrate layer;
an active layer which has a multiple quantum well structure and which is disposed above the first layer; and
a second layer which is disposed above the active layer, and which has a two-dimensional periodic structure in a surface thereof, the second layer comprising multiple layers including an intermediate layer having a refractive index that is less than or equal to a refractive index of a well layer of the multiple quantum well structure and that is higher than a refractive index of any other constituent layer of the second layer, wherein the intermediate layer is provided outside the two-dimensional periodic structure.

17. The light emitting device according to claim 15, wherein a distance between a bottom of the two-dimensional periodic structure and a top of the active layer is in a range of 0.1nλ to nλ, where n is a refractive index of a layer between the bottom of the two-dimensional periodic structure and the top of the active layer, and λ is an optical wavelength of light emitted from the active layer.

18. The light emitting device according to claim 16, wherein a distance between a bottom of the two-dimensional periodic structure and a top of the active layer is in a range of 0.1nλ to nλ, where n is a refractive index of a layer between the bottom of the two-dimensional periodic structure and the top of the active layer, and λ is an optical wavelength of light emitted from the active layer.

19. The light emitting device according to claim 15, further comprising a high reflectance layer interposed between the substrate layer and the first layer.

20. The light emitting device according to claim 16, further comprising a high reflectance layer interposed between the substrate layer and the first layer.

* * * * *